(12) United States Patent
Nwankpa et al.

(10) Patent No.: US 9,996,644 B2
(45) Date of Patent: Jun. 12, 2018

(54) SOLVER FOR HARDWARE BASED COMPUTING

(71) Applicants: Chika Nwankpa, Philadelphia, PA (US); Anthony Deese, Richmond, VA (US); Aaron St. Leger, Warminster, PA (US); Jeffrey Yakaski, Sharon Hill, PA (US); Jeremy Johnson, Berwyn, PA (US); Prawat Nagvajara, Narberth, PA (US); Petya Vachranukunkiet, Warminster, PA (US)

(72) Inventors: Chika Nwankpa, Philadelphia, PA (US); Anthony Deese, Richmond, VA (US); Aaron St. Leger, Warminster, PA (US); Jeffrey Yakaski, Sharon Hill, PA (US); Jeremy Johnson, Berwyn, PA (US); Prawat Nagvajara, Narberth, PA (US); Petya Vachranukunkiet, Warminster, PA (US)

(73) Assignee: DREXEL UNIVERSITY, Philadelphia, PA (US)

( * ) Notice: Subject to any disclaimer, the term of this patent is extended or adjusted under 35 U.S.C. 154(b) by 384 days.

(21) Appl. No.: 14/956,461

(22) Filed: Dec. 2, 2015

(65) Prior Publication Data
US 2016/0085893 A1    Mar. 24, 2016

Related U.S. Application Data

(63) Continuation of application No. 12/373,481, filed as application No. PCT/US2007/074630 on Jul. 27, 2007, now abandoned.
(Continued)

(51) Int. Cl.
*G06F 17/50*    (2006.01)
*G06F 17/16*    (2006.01)

(52) U.S. Cl.
CPC .......... *G06F 17/5027* (2013.01); *G06F 17/16* (2013.01)

(58) Field of Classification Search
None
See application file for complete search history.

(56) References Cited

U.S. PATENT DOCUMENTS 3,621,209 A    11/1971  Businger
4,787,057 A    11/1988  Hammond
(Continued)

FOREIGN PATENT DOCUMENTS

JP    2001016775 A2    1/2001

OTHER PUBLICATIONS

Chen et al., "Multiobjective Power Dispatch with Line Flow Constraints Using the Newton-Raphson Method", IEEE Trans. on Energy Conversion, vol. 12, No. 1, Mar. 1996 (Abstract Only).
(Continued)

*Primary Examiner* — Ilwoo Park
(74) *Attorney, Agent, or Firm* — Mendelsohn Dunleavy, P.C.

(57) ABSTRACT

Full-AC load flow constitutes a core computation in power system analysis. A performance gain with a hardware implementation of a sparse-linear solver using a Field Programmable Gate Array (FPGA) is achieved by use of a DC network emulation of the power system bus. Analog Behavioral Models (ABMs) are used in an efficient strategy for designing analog emulation engines for large-scale power system computation. A generator model is also developed using analog circuits for load flow emulation for power system analysis to reduce computation time. The generator model includes reconfigurable parameters using operational
(Continued)

Computationally Feasible Bus Voltage transconductance amplifiers (OTAs). The circuit module is used with other reconfigurable circuits, i.e., transmission lines and loads.

18 Claims, 28 Drawing Sheets

Related U.S. Application Data

(60) Provisional application No. 60/820,549, filed on Jul. 27, 2006.

(56) References Cited

U.S. PATENT DOCUMENTS

| | | |
|---|---|---|
| 6,601,080 B1 | 7/2003 | Garg |
| 2006/0064452 A1 | 3/2006 | Nakanishi |
| 2006/0176983 A1 | 8/2006 | Wadsworth et al. |
| 2007/0159416 A1 | 7/2007 | Whight |
| 2008/0300848 A1 | 12/2008 | Beattie et al. |

OTHER PUBLICATIONS

Song et al., "Reactive Reserve-Based Contingency Constrained Optimal Power Flow (RCCOPF) for Enhancement of Voltage Stability Margins", IEEE Trans. on Power Systems, vol. 18, No. 4, Nov. 2003 (Abstract Only).
Johnson et al., "Performance Analysis of Load Flow Computing Using FPGA", 15th PSCC, Liege, Aug. 22-26, 2005, Session 14, Paper 3, 7 pages.
Olaleye et al., "Analog Behavioral Models and the Design of Analog Emulation Engines for Power System Computation",15th PSCC, Liege, Aug. 22-26, 2005, Session 38, Paper 4, 6 pages.
Nwankpa et al., "Power System on Chip (PSoC): Analog Emulation for Power System Applications", Power Engineering Society General Meeting, 2006. IEEE, 6 pages.
Fried, et al., "Low-Power CMOS, Analog Transient-Stability-Simulator for a Two-Machine Power—System", IEEE International Symposium on Circuits and Systems, Jun. 1997, Hong Kong, pp. 137-140.
Fried, et al., "Approaches for Analog VLSI Simulation of the Transient Stability of Large Power Networks", IEEE Transactions on Circuits and Systems-I: Fundamental Theory and Applications, vol. 46, No. 10, Oct. 1999, pp. 1249-1263.
Fried, et al., "Analog VLSI Solution to the Stability Study of Power Networks", ICES, 1996, pp. 239-242.
Gu, et al., "Real-Time Analysis of Transient Stability Using Reconfigurable analog VLSI", IEEE Tamsaction on Power Systems, vol. 80, No. 3, Aug. 2003, pp. 1207-1209.
Yakaski, et al., "Insight into Reconfigurable Analog Emulation of the Classical Generator Model", Presented at the 36th Annual North American Power Symposium, University of Idaho, Moscow, Idaho, 2004.
Wunderlich, et al., "A Linear Operational Transconductance Amplifier with Automatic Offset Cancellation and Transconductance Calibration", University of Dortmund, AG Mikroelecktronik, Postfach, 44221 Dortmond, Germany, 1999, 4 pages.
Olaleye, M.B., & Nwankpa, C.O., "Analog Behavioral Models for the Purpose of Analog Emulation of Large Scale Power Systems", Presented at the 36th Annual North American Power Symposium, University of Idaho, Moscow, Idaho, 2004.
St. Leger et al., "Reconfigurable Transmission Line Model for Analog Power Flow Computation", Philadelphia, PA, Drexel University, 2005, available at http://power.ece.drexel.edu/publications.html.
Yakaski et al., "Analog Emulation Using a Reconfigurable Classical Generator Model for Load Flow Analysis", Philadelphia, PA, Drexel University, ECE Department, 2005, available at http://power.ece.drexel.edu/publications.html.

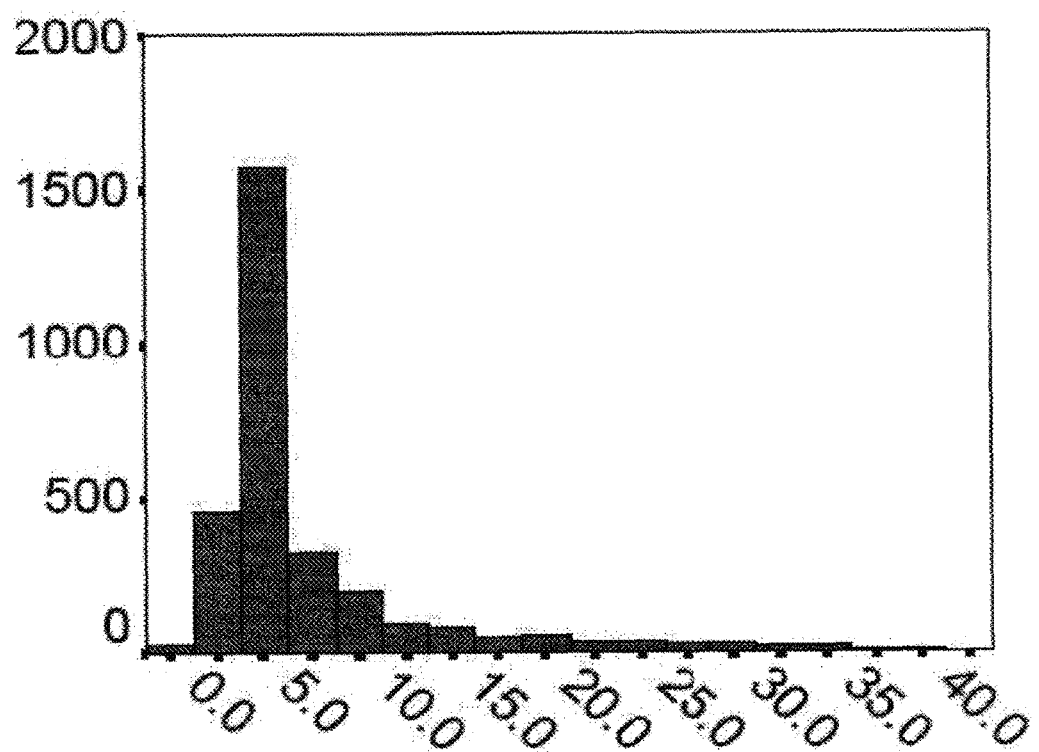
Figure 1: SYMAMD Elimination Row Histogram

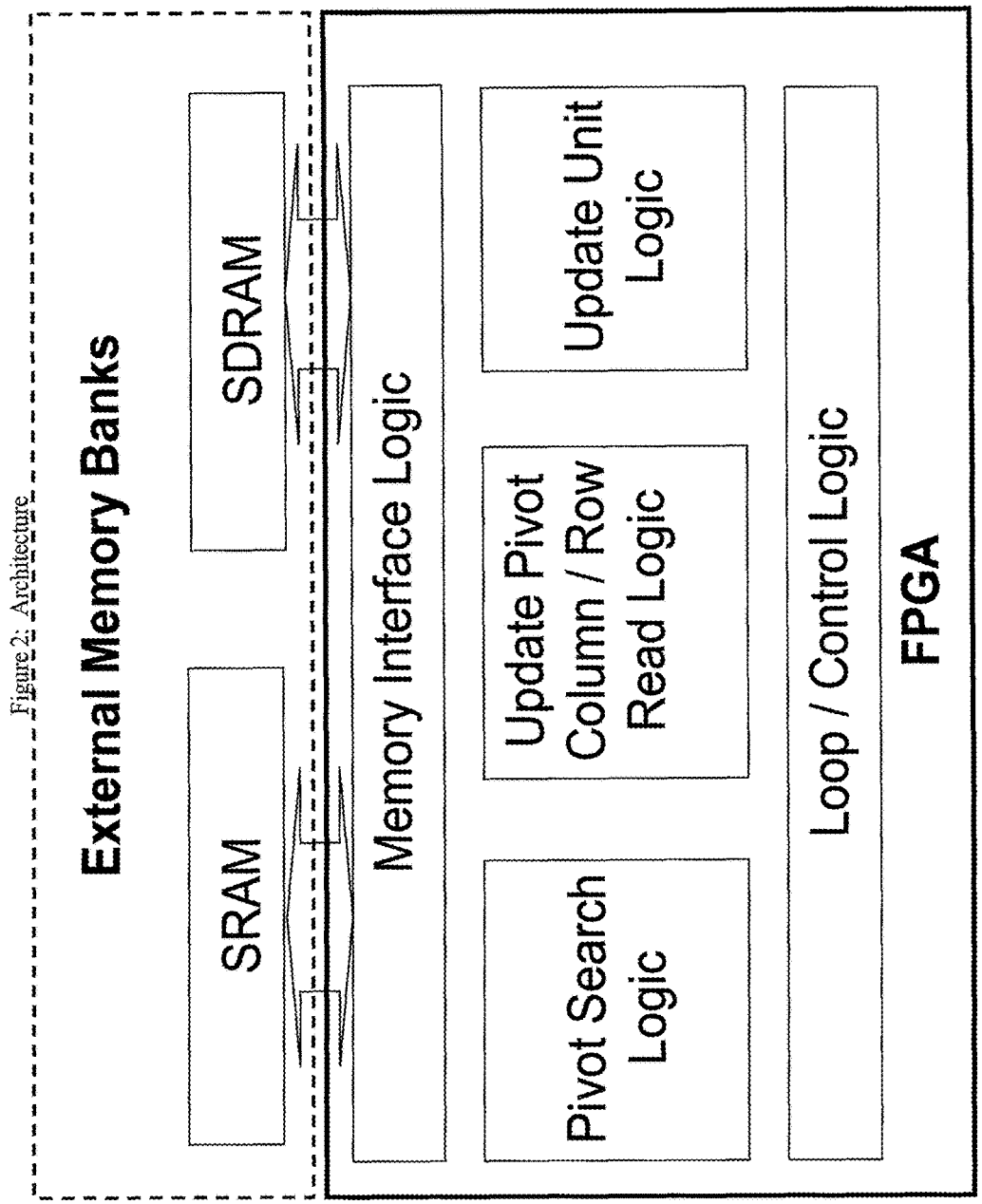

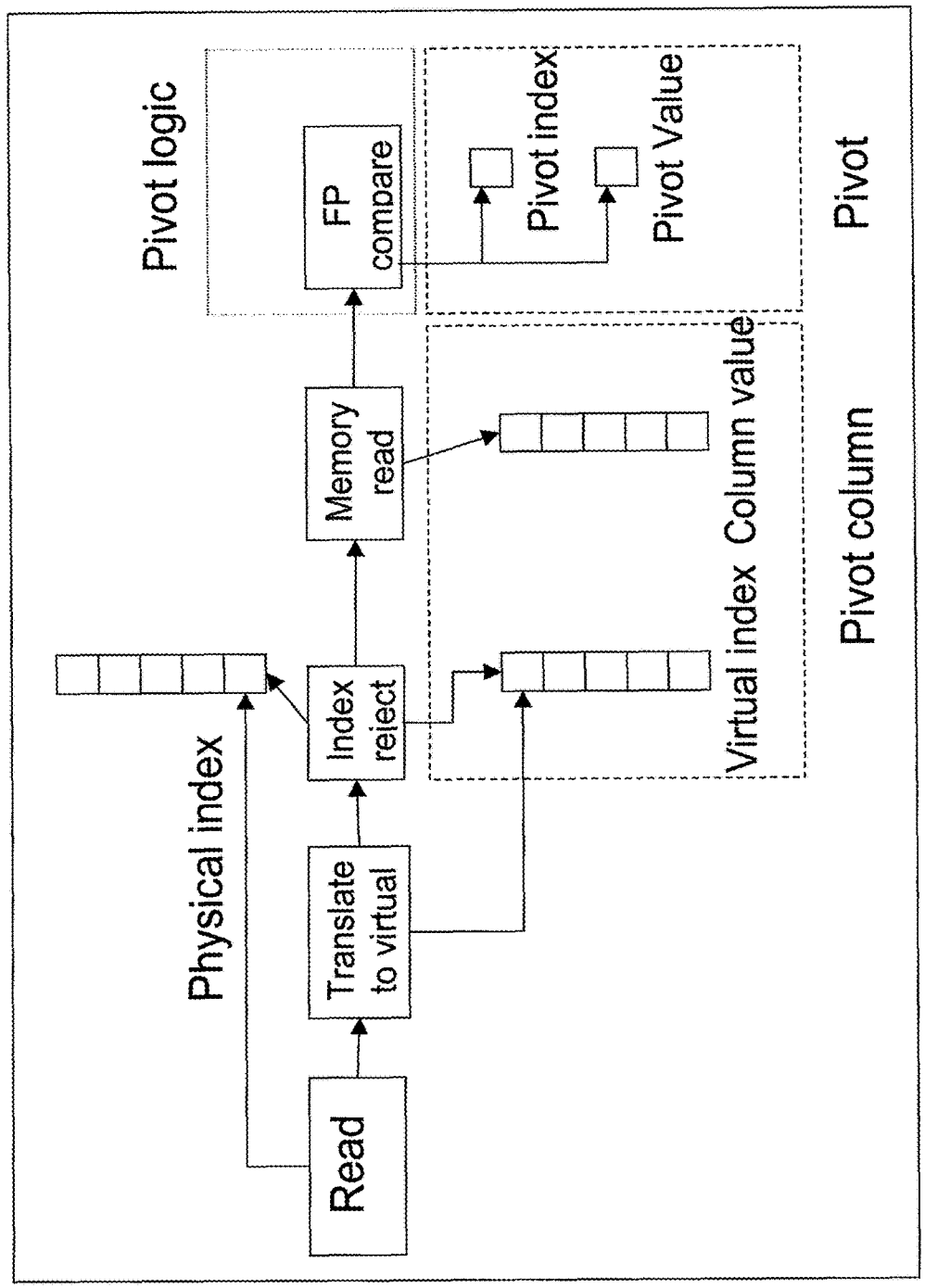
Figure 3: Pivot Search

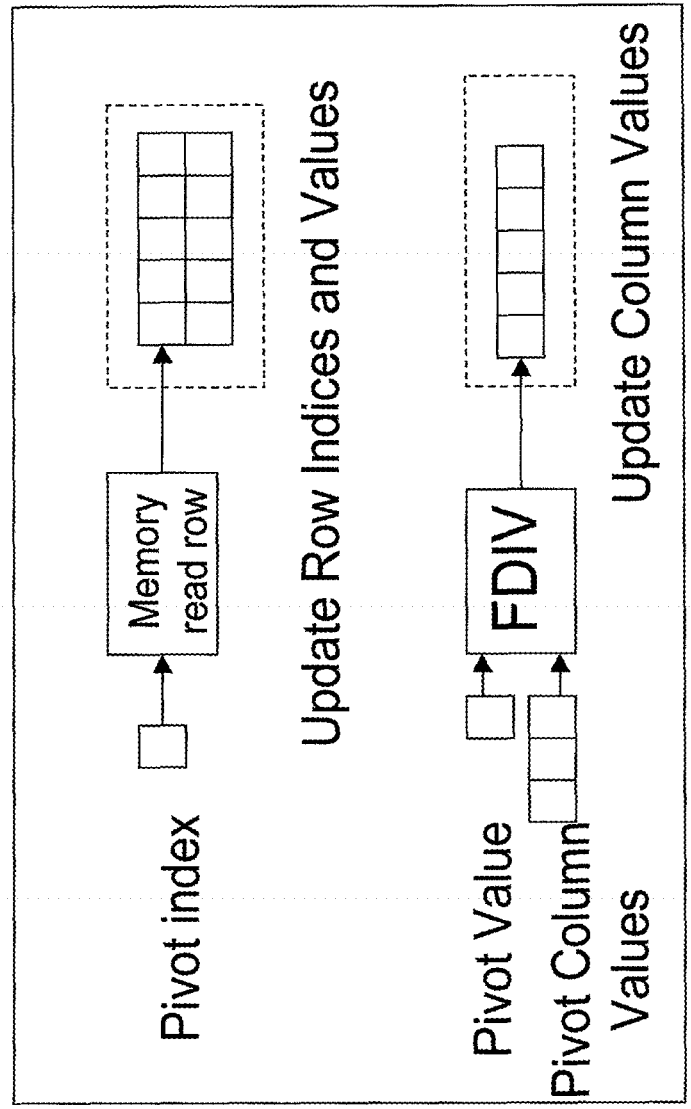
Figure 4: Update Pivot Column/Row Read

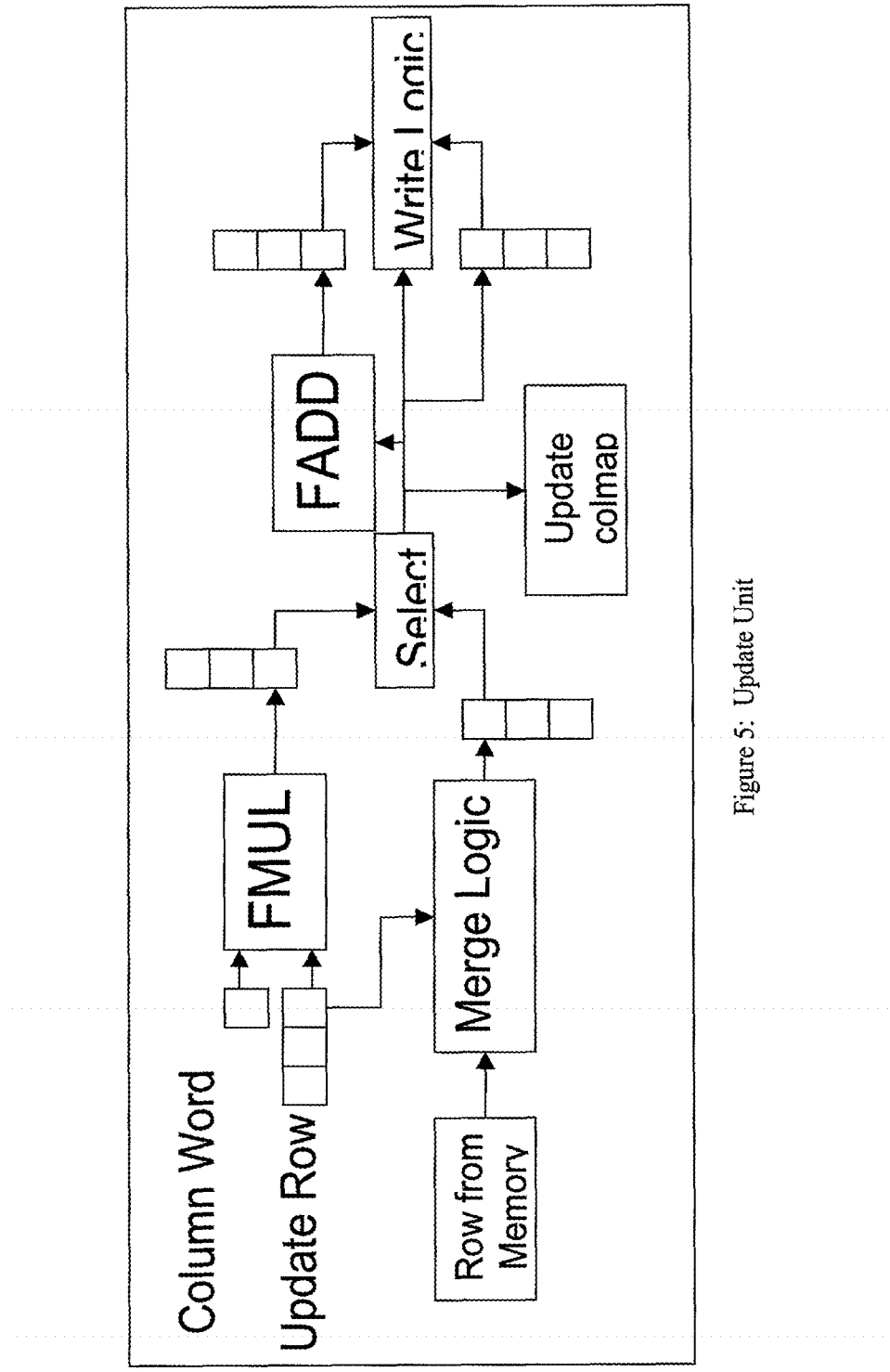
Figure 5: Update Unit

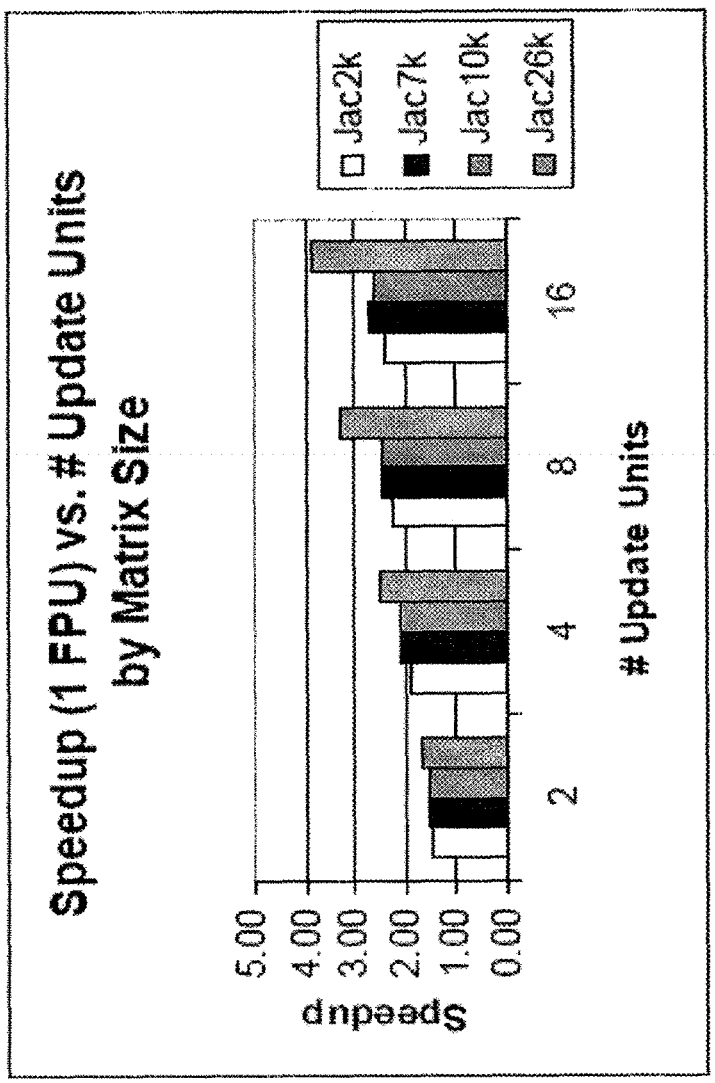
Figure 6: Speedup and Scaling of LU Hardware

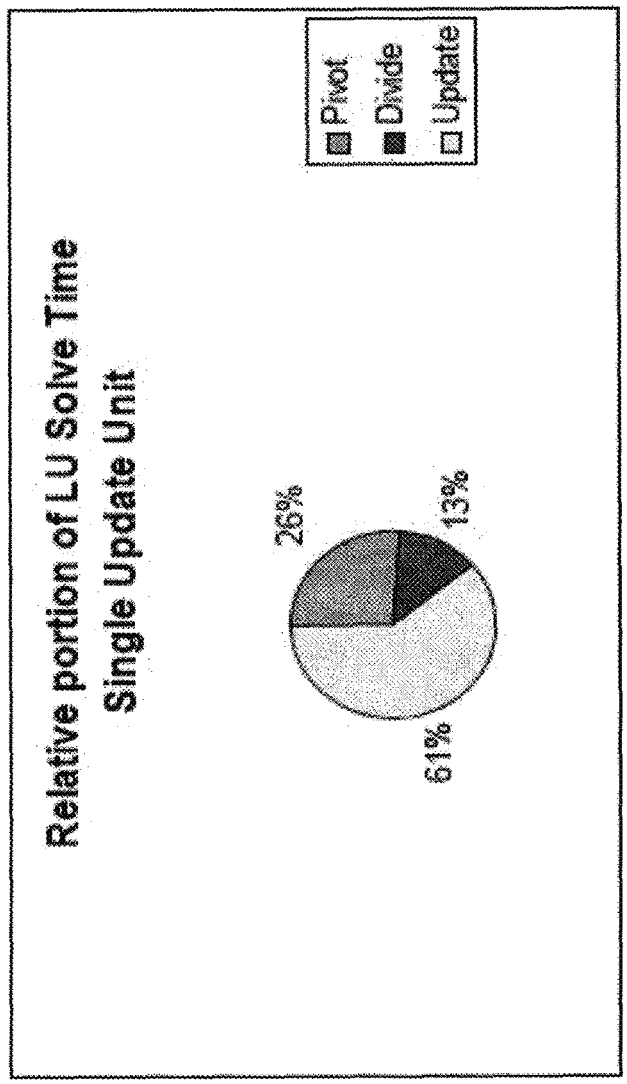
Figure 7: Relative Solve Time for Single Update Unit

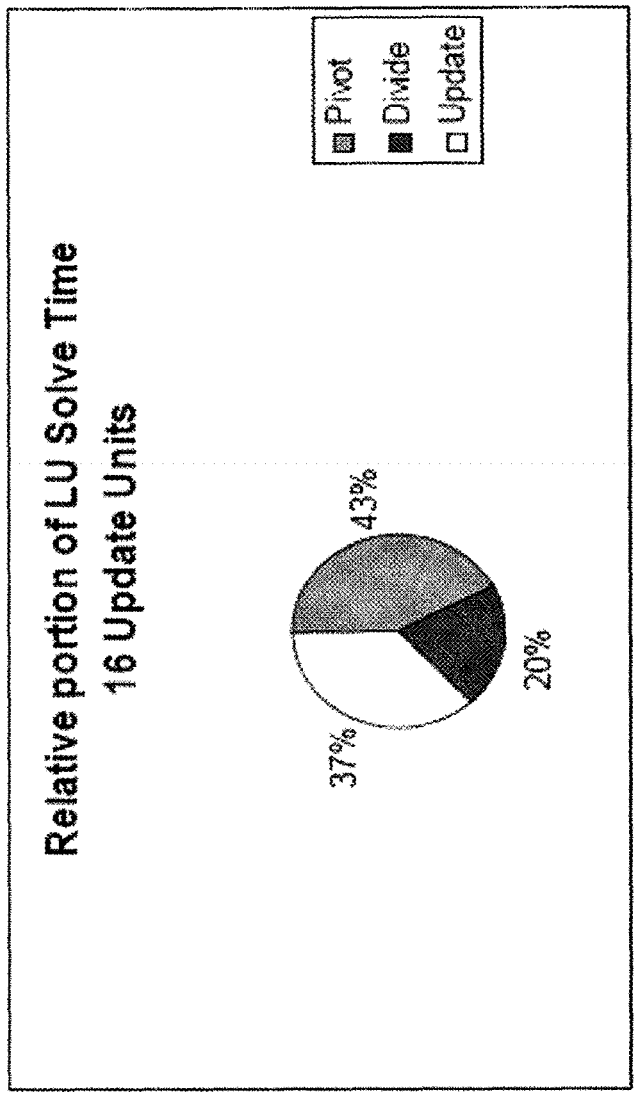
Figure 8: Relative Solve Time for 16 Update Units

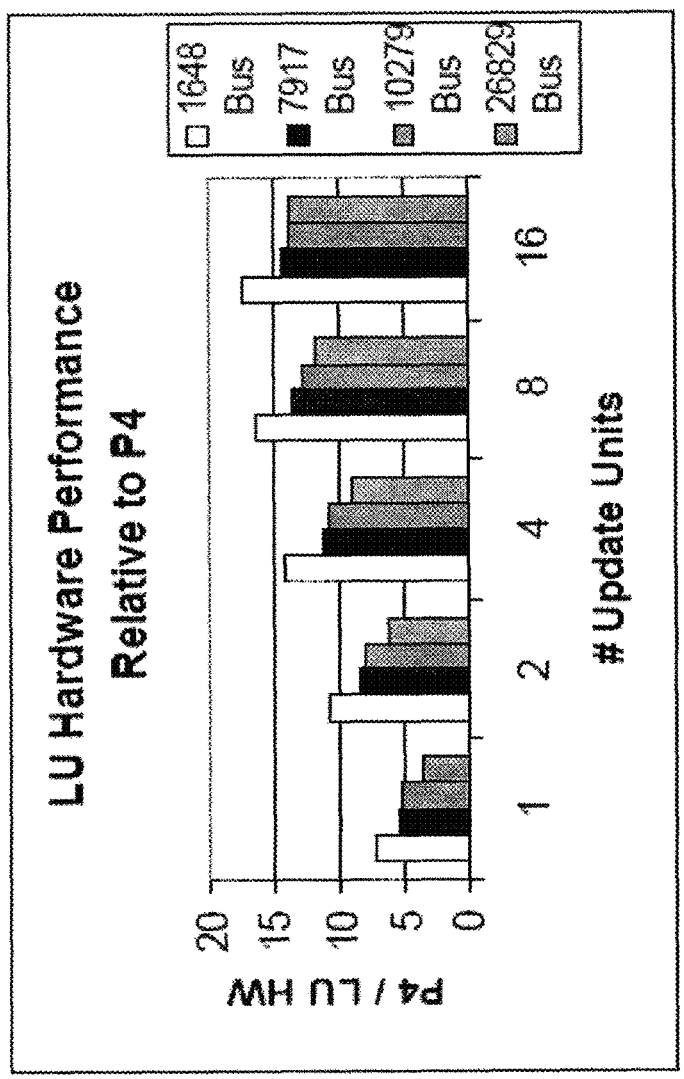
Figure 9: LU Hardware Performance Relative to Pentium 4

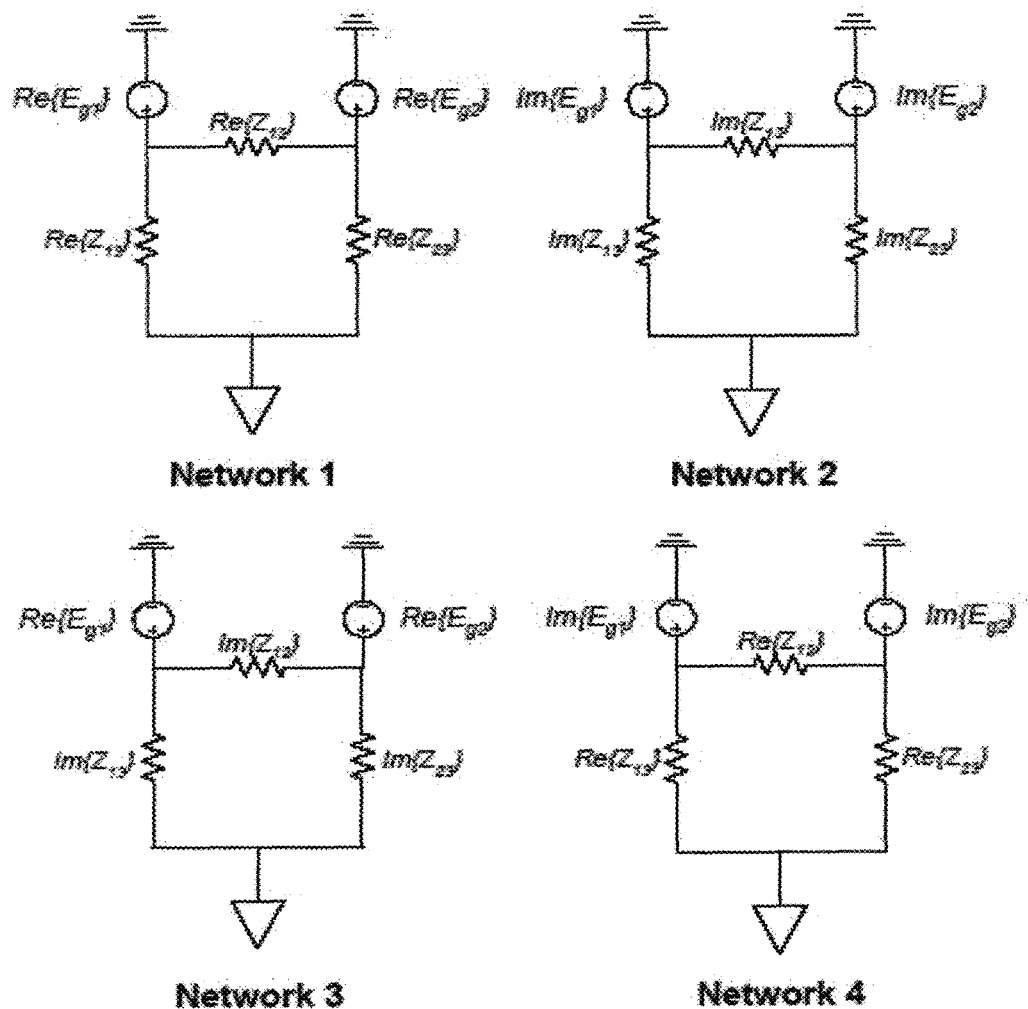
Figure 10: DC Network Emulation for a Three-Bus Power System

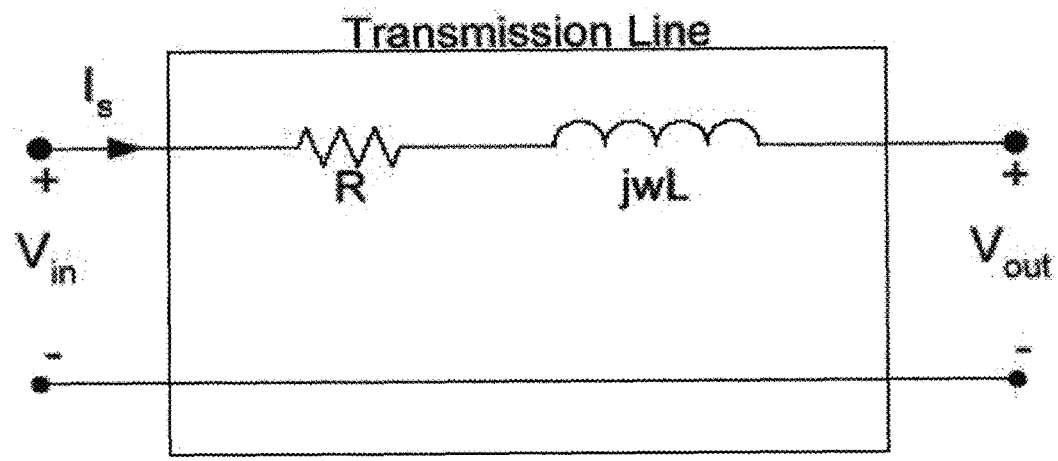
Figure 11: Lossy Transmission Line Model
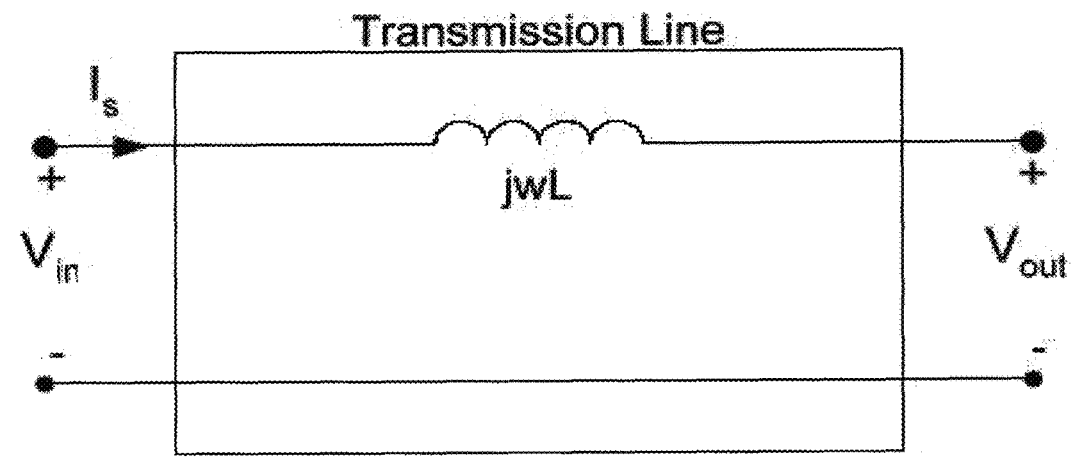
Figure 12: Lossless Transmission Line Model

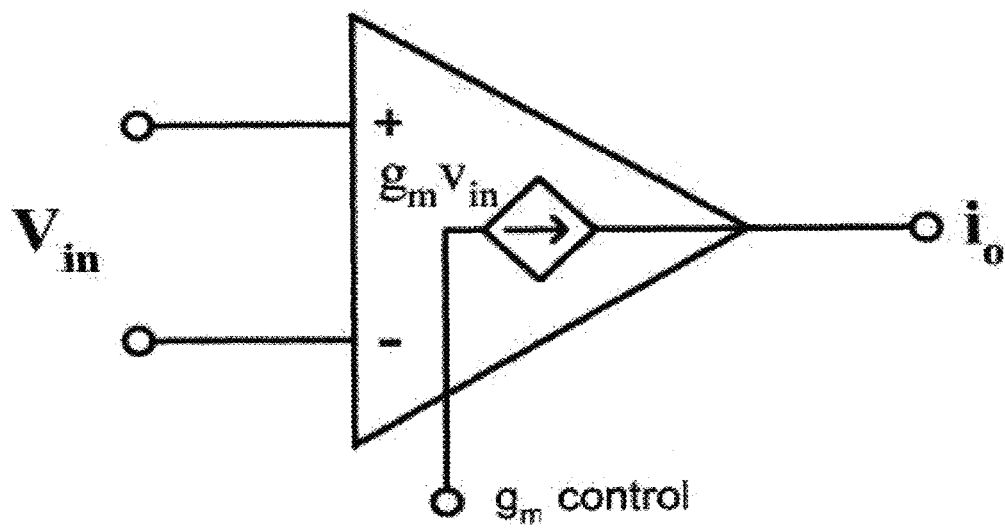
Figure 13: Ideal OTA
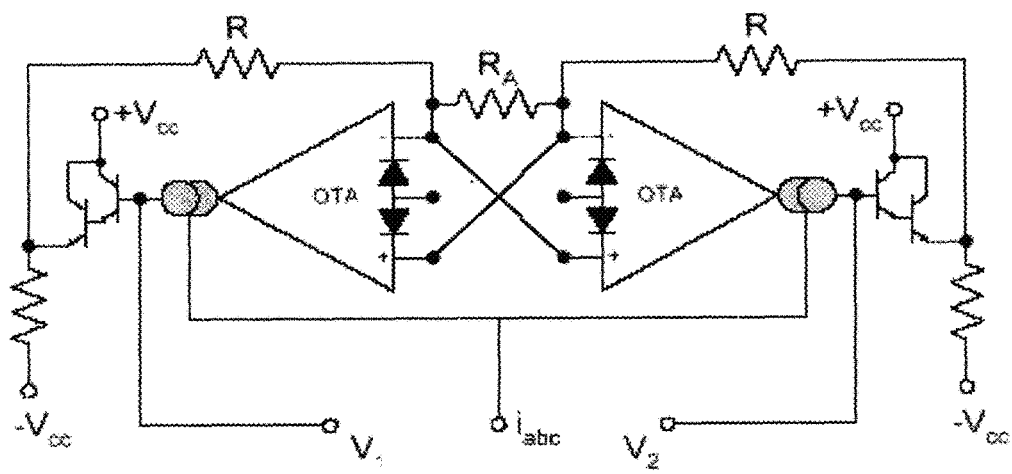
Figure 14: Double Ended OTA Transmission Line Model [30]

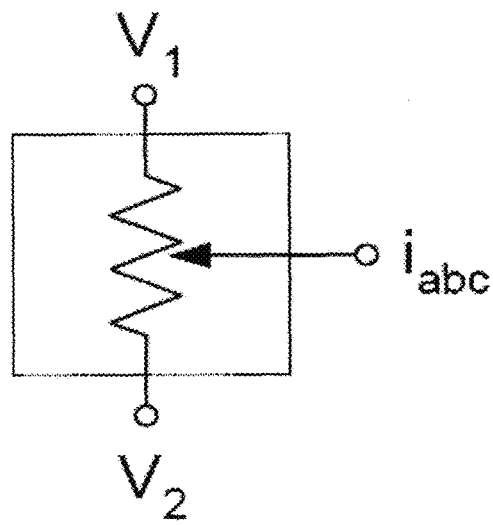
Figure 15: Potentiometer Relationship to OTA Model
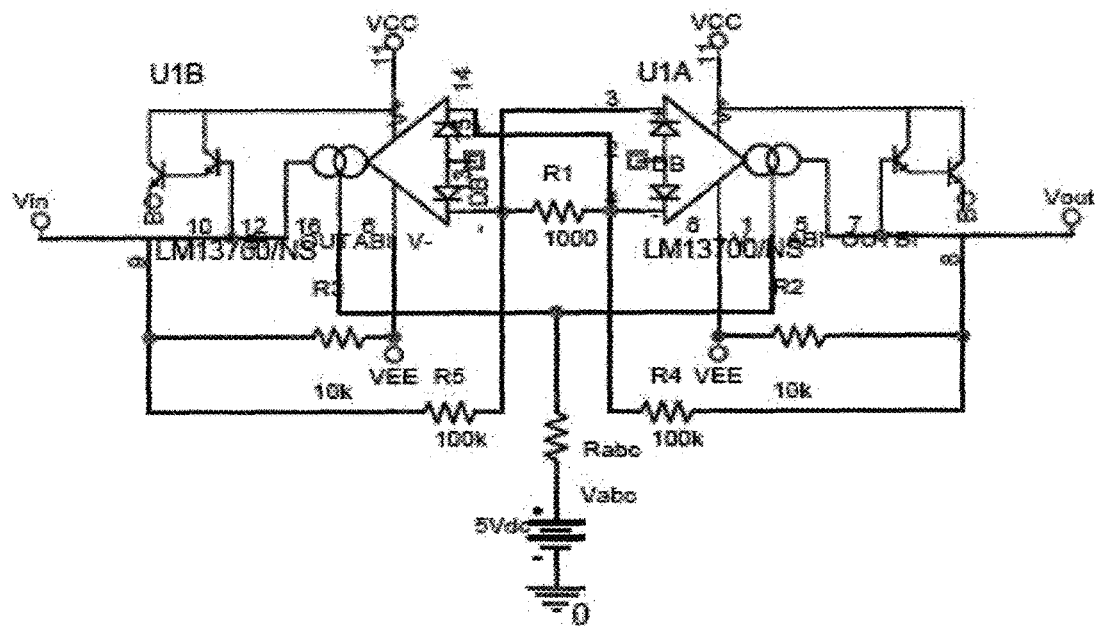
Figure 16: PSpice Schematic for Bias Current Control

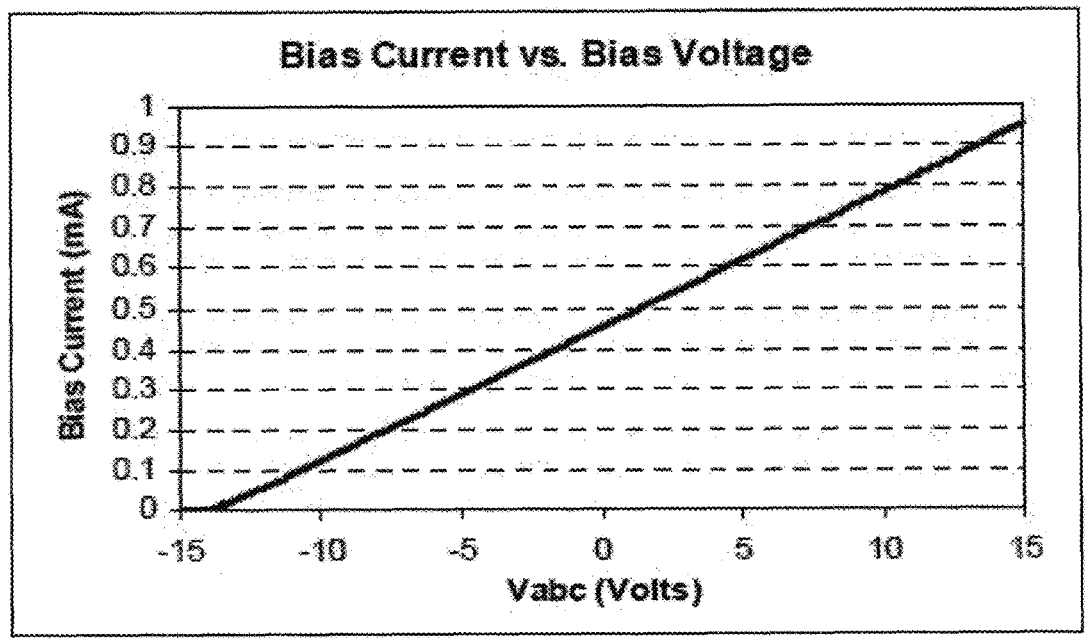
Figure 17: Bias Current vs. Bias Voltage
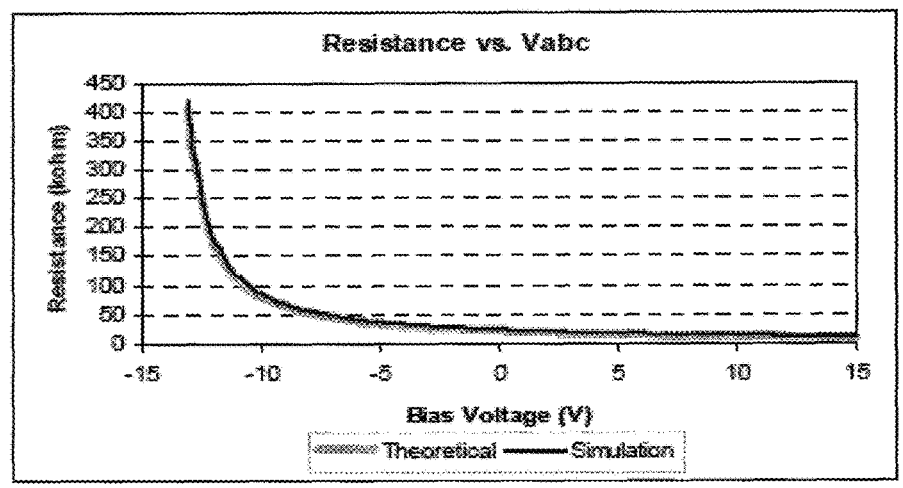
Figure 18: Theoretical and Simulated Resistance vs. Bias Voltage

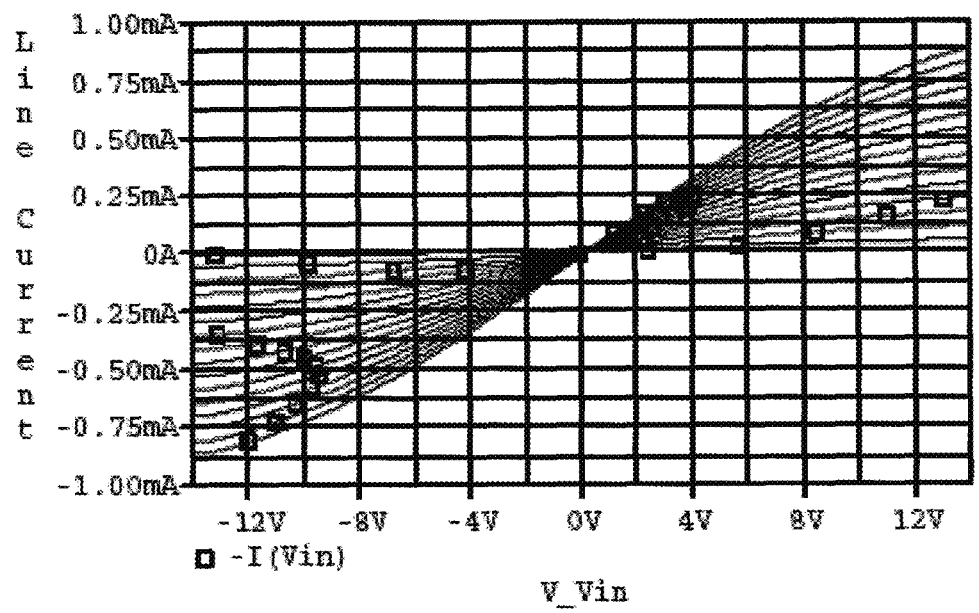
Figure 19: Line Current vs. Line Voltage
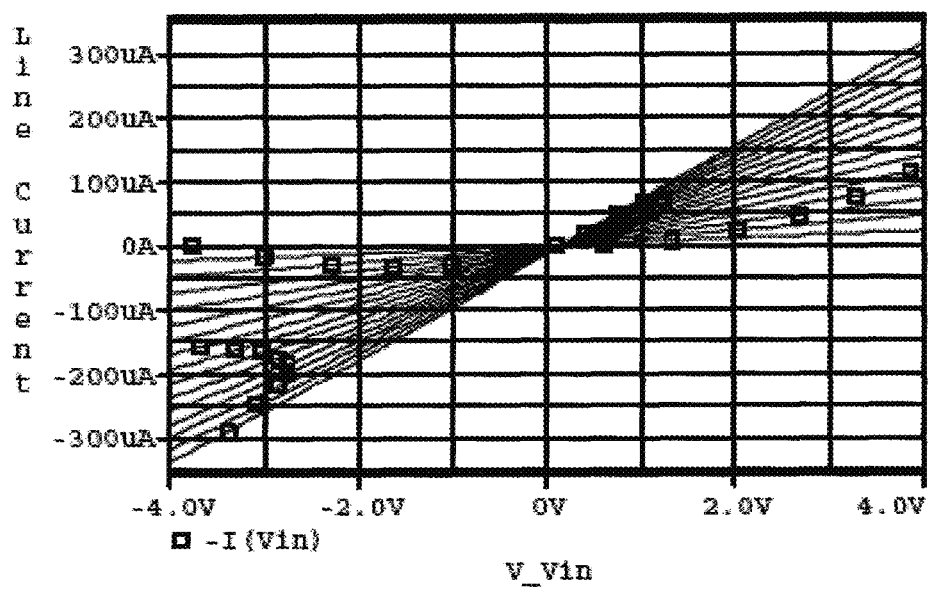
Figure 20: Line Current vs. Line Voltage Linear Region

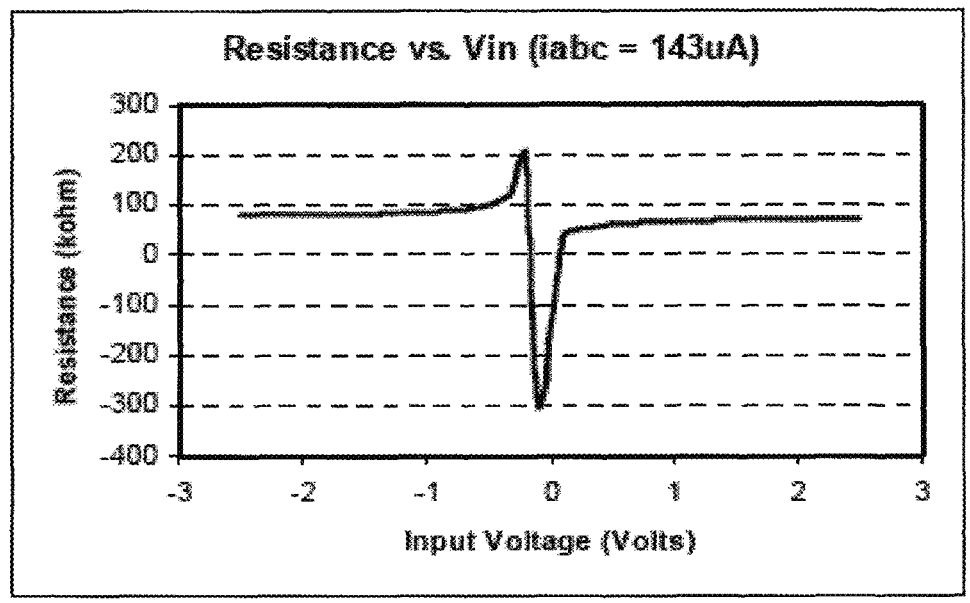
Figure 21: Effective Resistance of Line Model
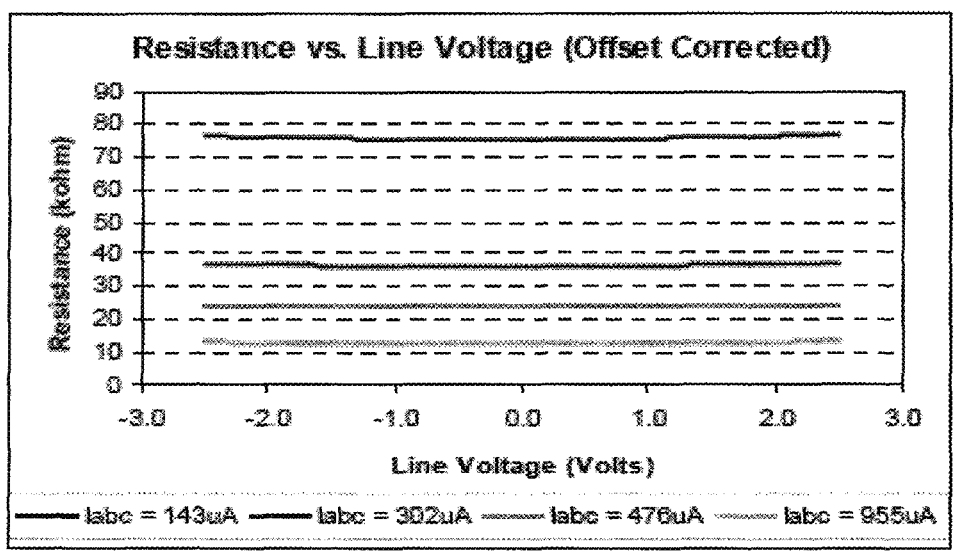
Figure 22: Effective Resistance of Line Model vs. Line Voltage

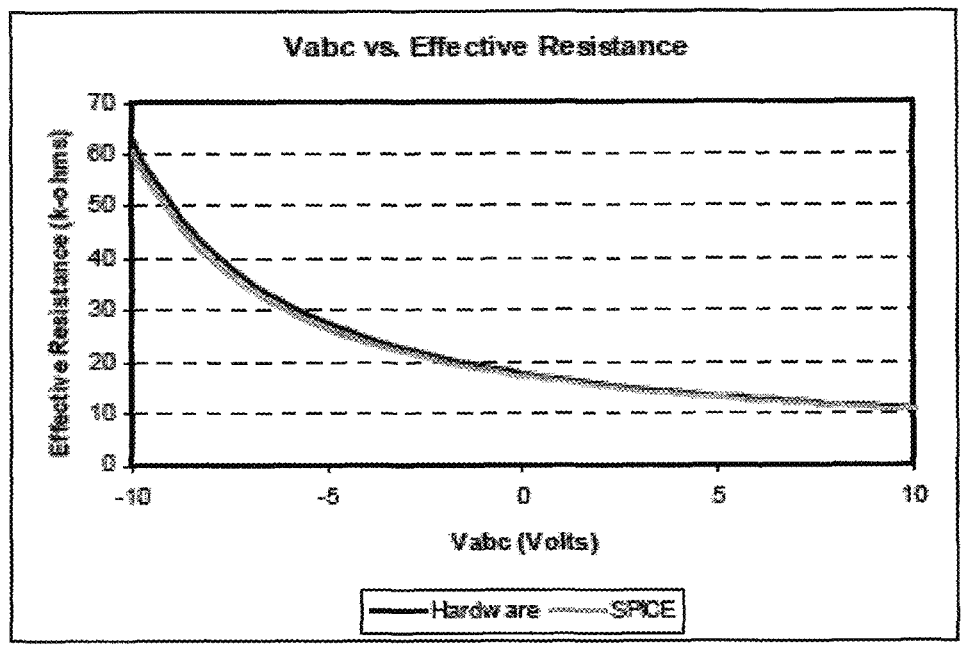
Figure 23: Hardware and Spice Effective Resistance vs. Bias Voltage
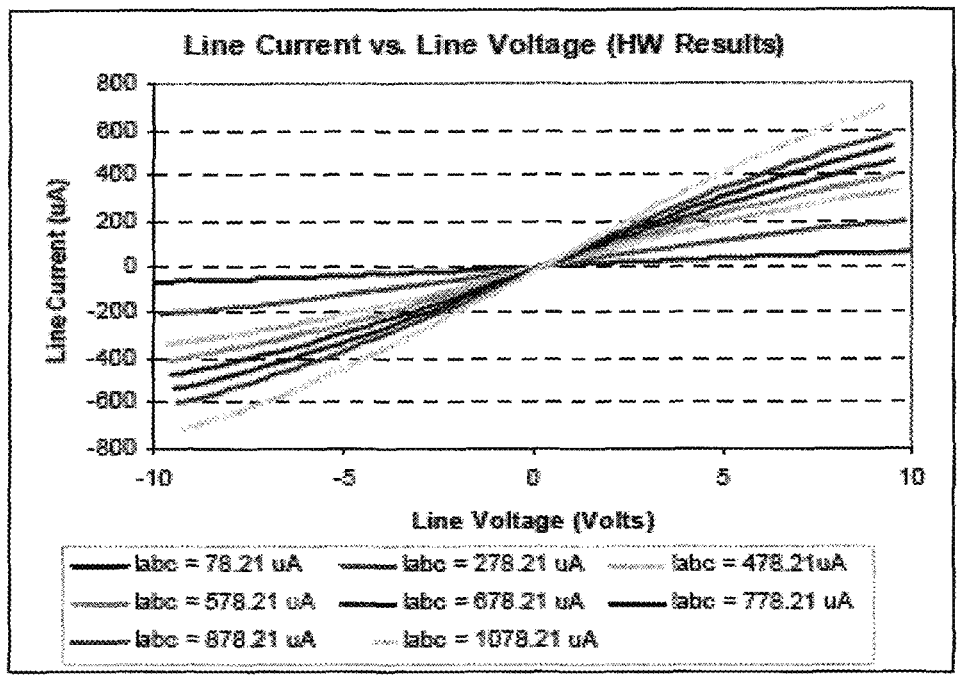
Figure 24: HW Line Current vs. Line Voltage for Various Bias Currents

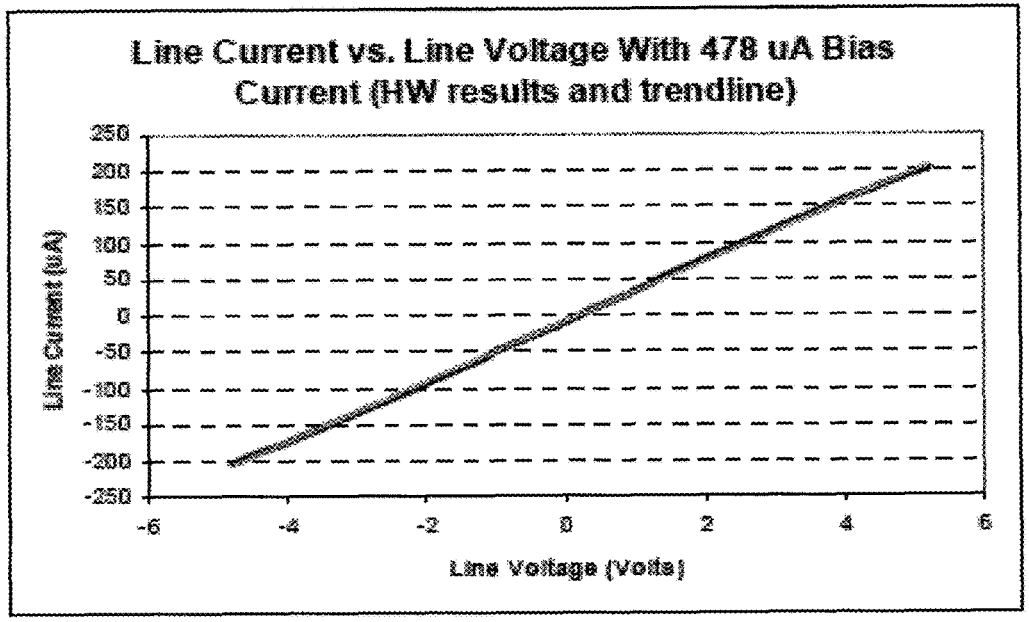
Figure 25: Line Current Linearity
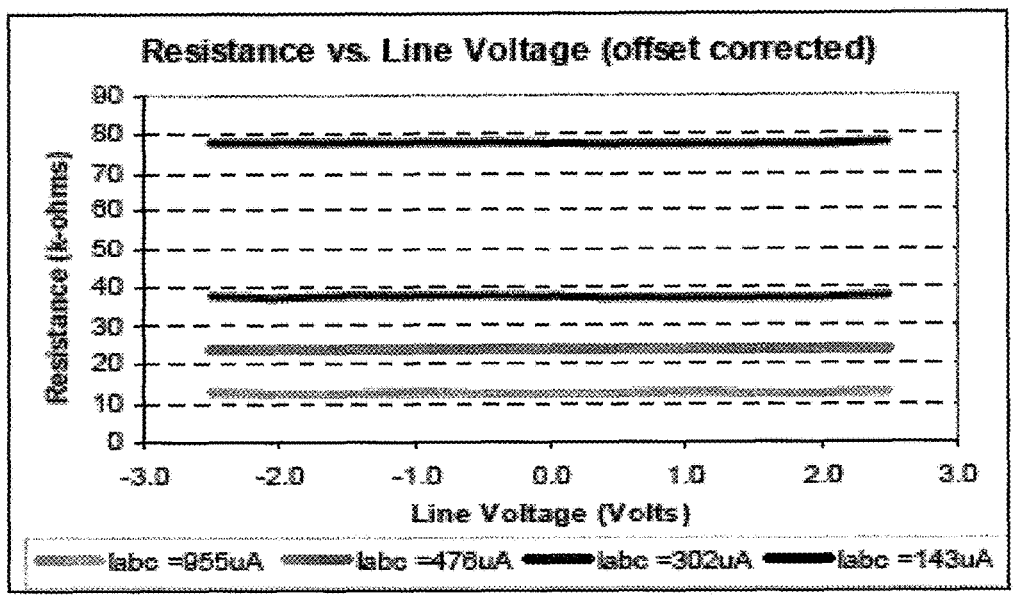
Figure 26: HW Resistance vs. Line Voltage

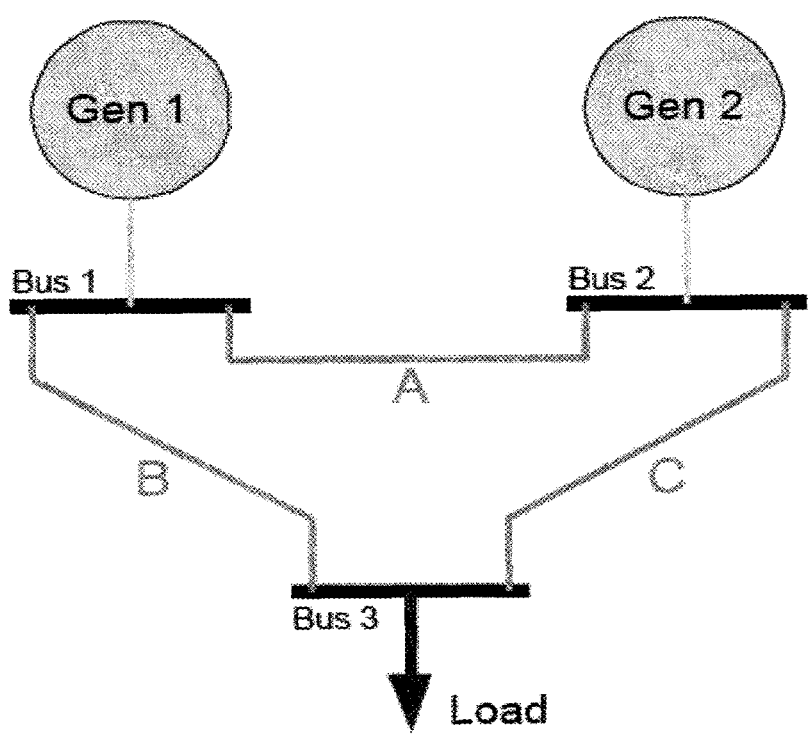
Figure 27: Three Bus Power System Topology

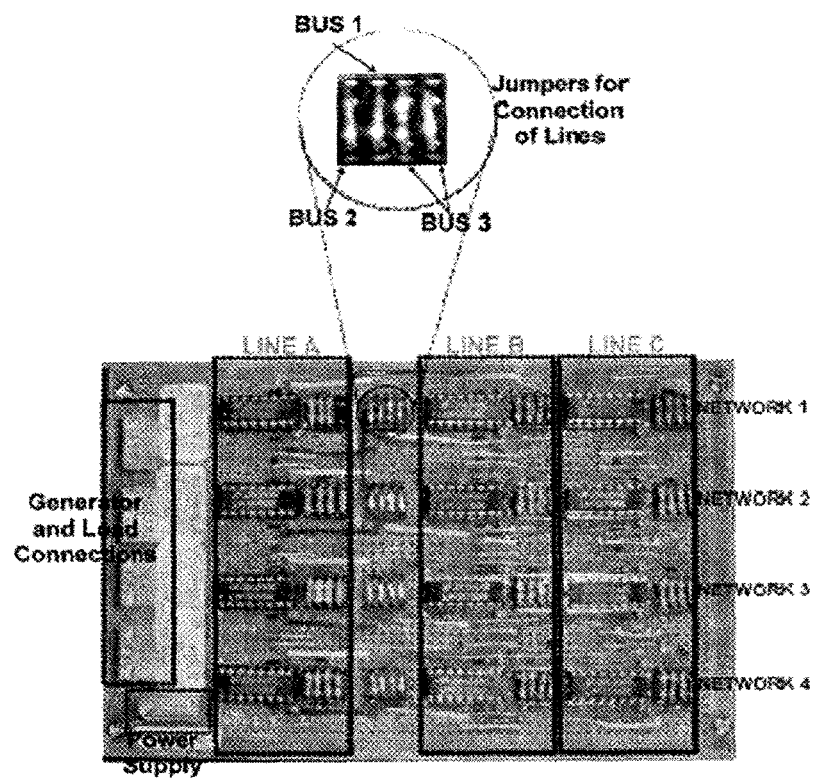
Figure 28: Three Bus Prototype Board
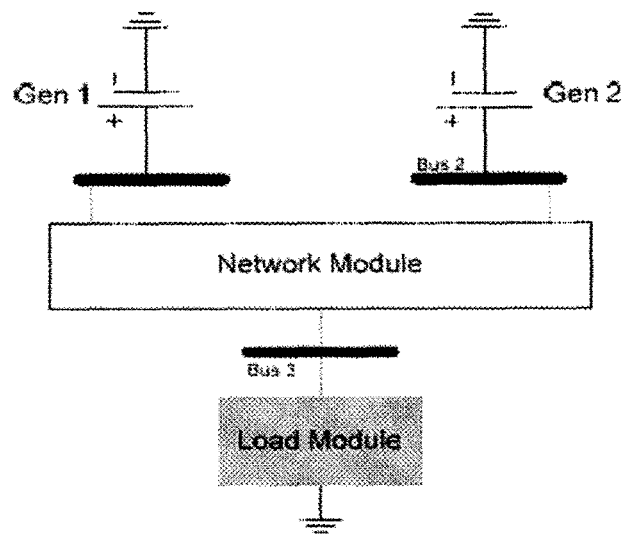
Figure 29: Emulation Circuit Setup

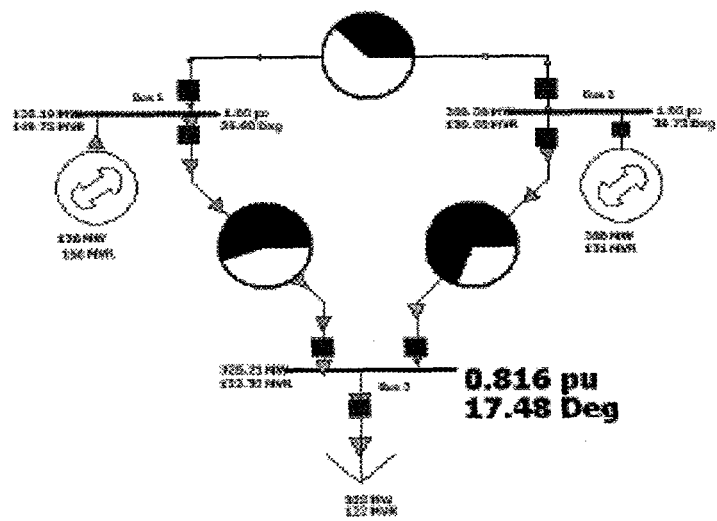
Figure 30: PowerWorld® Power Flow Solution
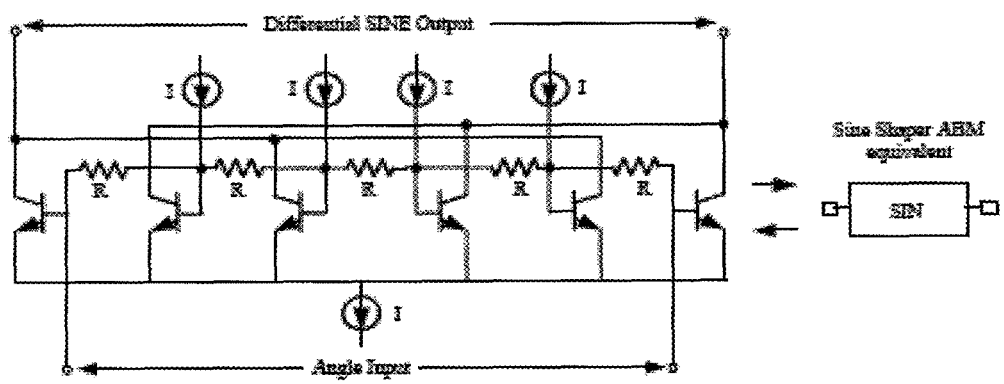
Figure 31: Analog and ABM Sine Shaper

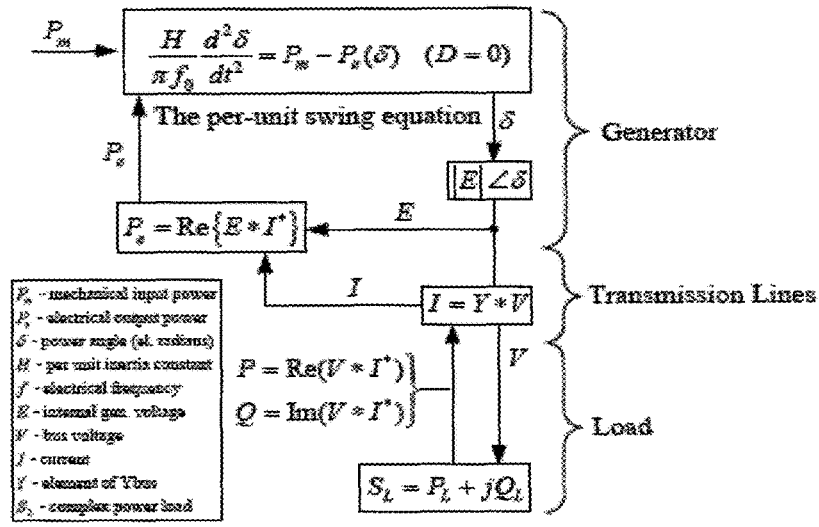
Figure 32: Block Diagram of Core Computation Methodology of an Analog Emulator
$$I = YV = (Y_r + jY_i)(V_r + jV_i)$$
$$= (V_rY_r - V_iY_i) + j(V_rY_i + V_iY_r)$$
Network 1  Network 3
   Network 2   Network 4
       $I_r$        $I_i$
Figure 33: Complex Current Computation Methodology

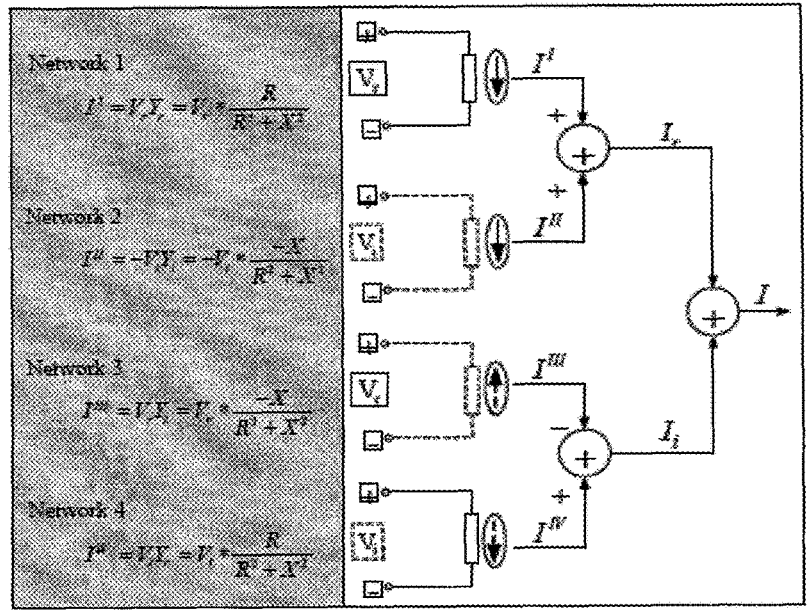
Figure 34: Complex Current Computation Implementation
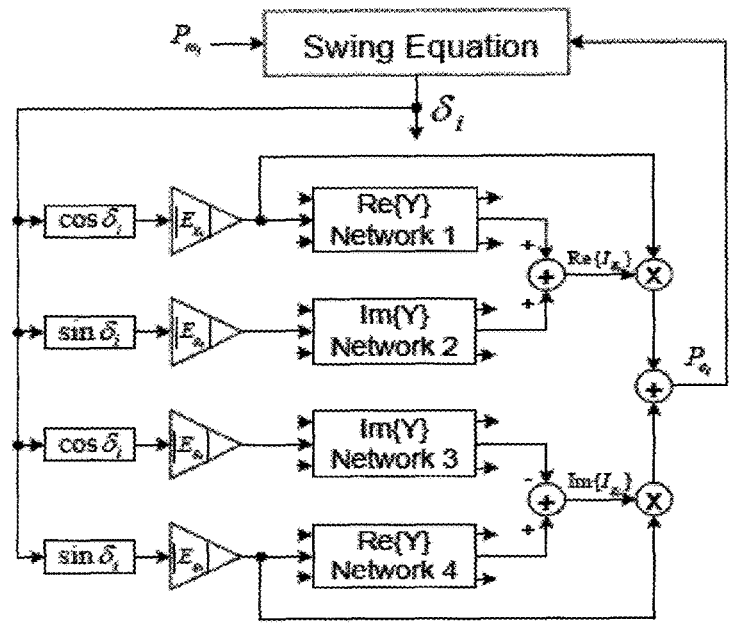
Figure 35: Generator Real Power Computation Methodology

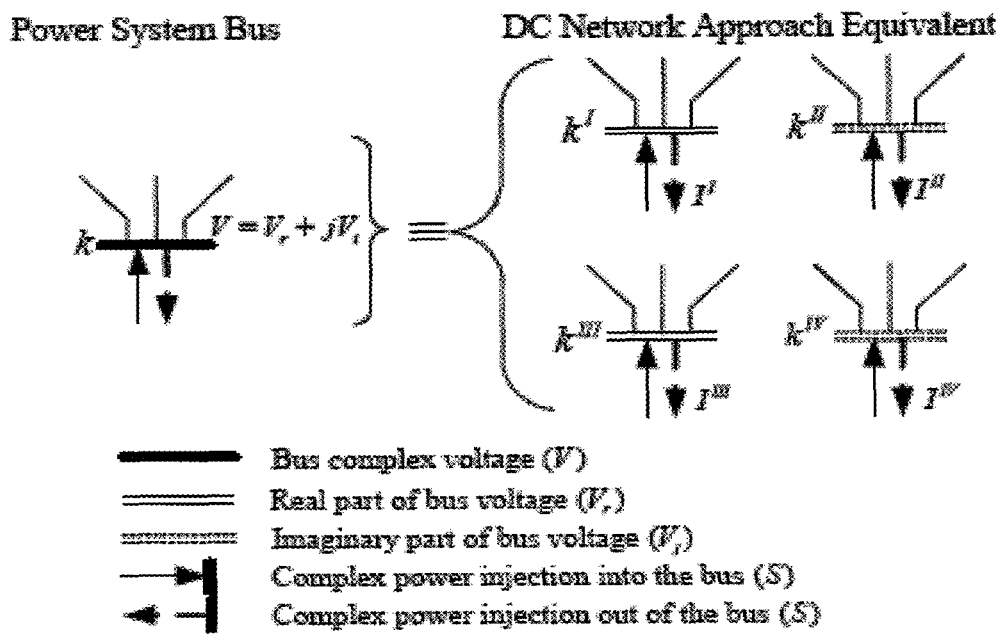
Figure 36: Computationally Feasible Bus Voltage
$$\left.\begin{array}{c}P\\Q\end{array}\right\} \to I \text{ (1 pu : 1 A)}$$
$$\delta \to V \text{ (1 radian : 1 volt)}$$
$$I \to V \text{ (1 A : 1 volt)}$$
Figure 37: Variable Representation in Analog Emulator

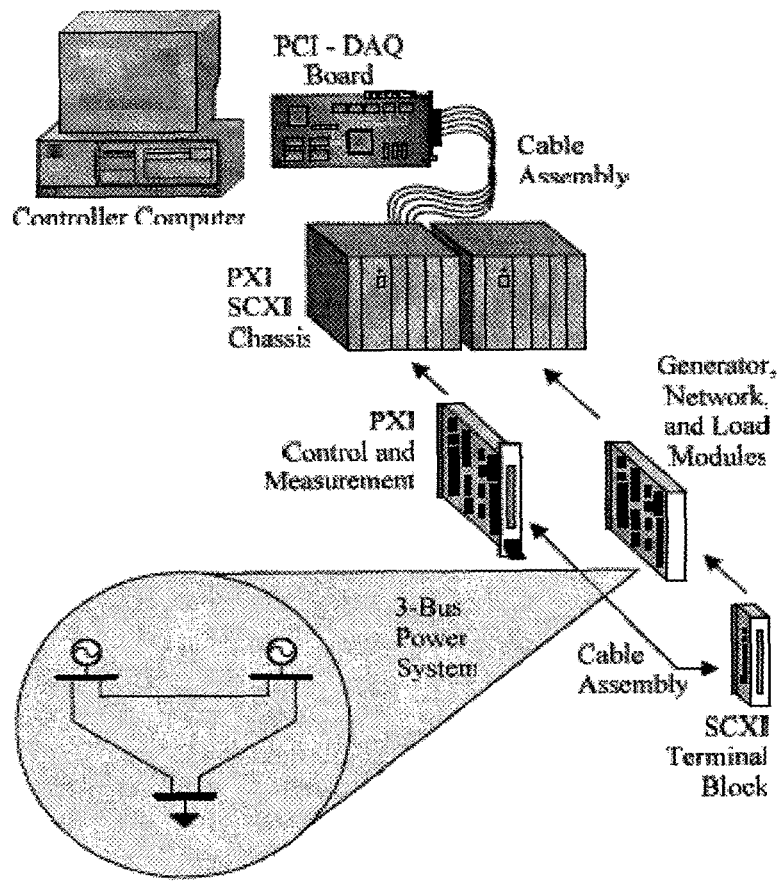
Figure 38: Power System Emulator Hardware Setup
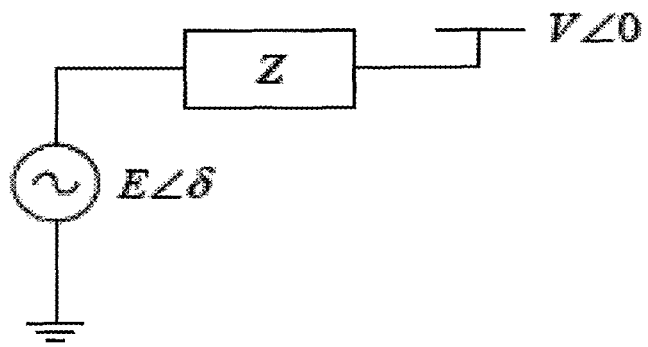
Figure 39: Classical Generator Model

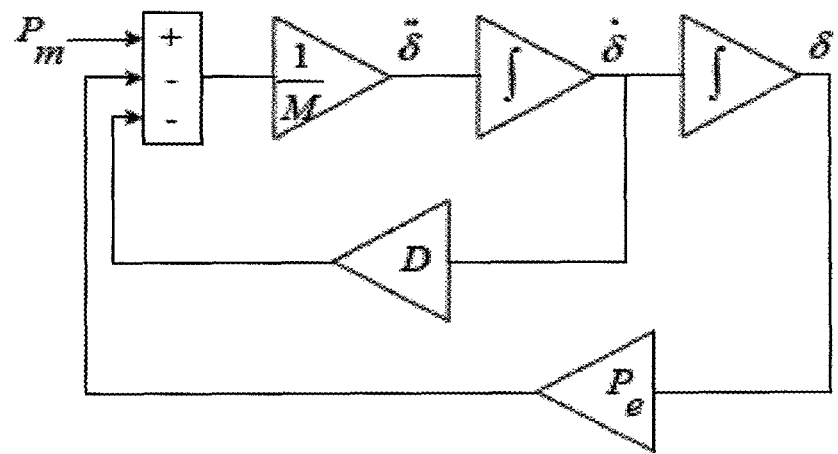
Figure 40: Swing Equation Functional Block Diagram
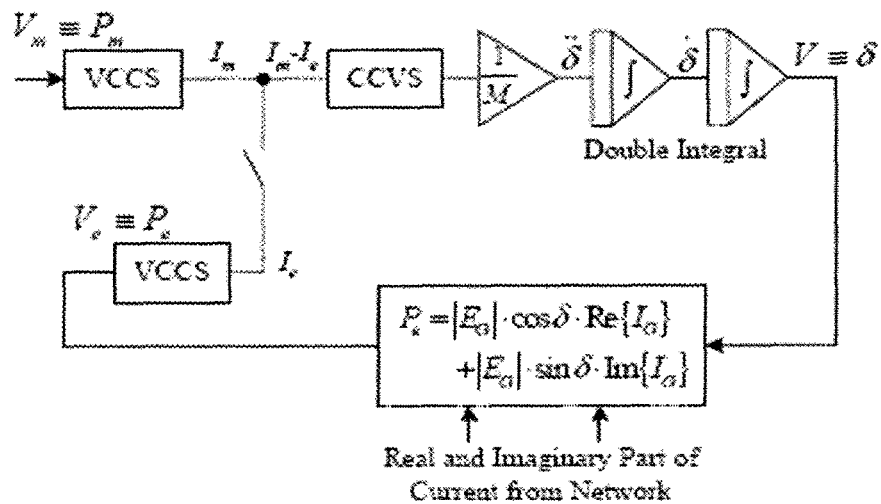
Figure 41: Generator Model Functional Block Diagram

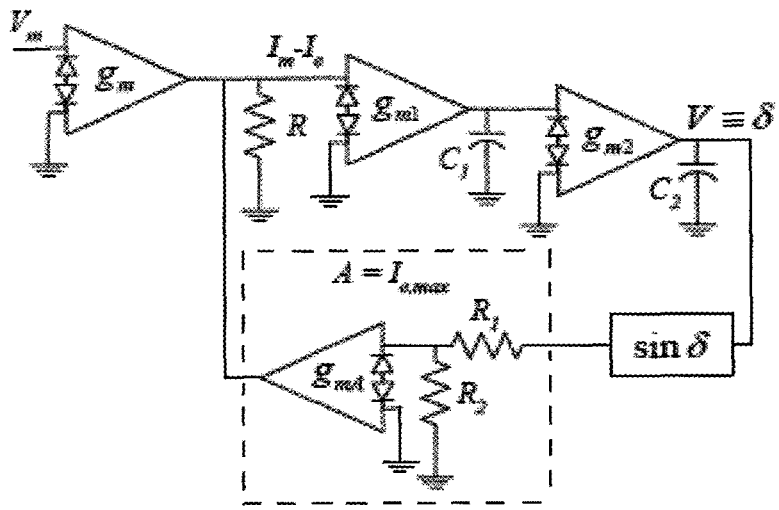
Figure 42: Single-Machine CMOS Analog Emulator
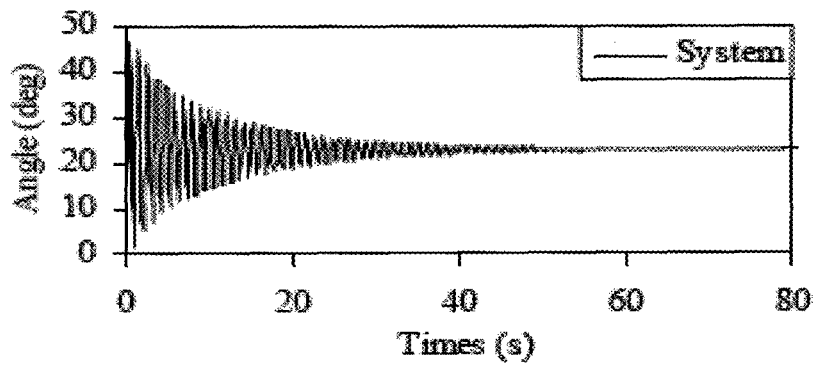
43a: Results of Power System
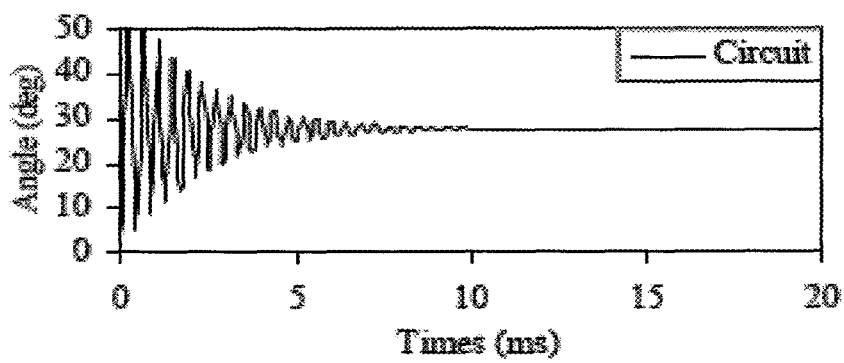
Figure 43b: Results of Analog Emulator

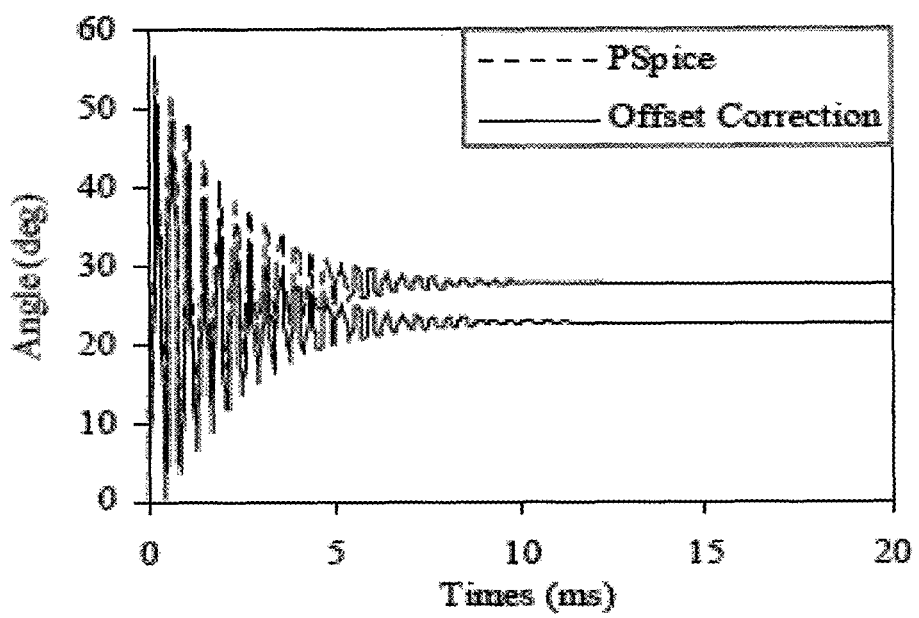
Figure 44: Results of Analog Emulator with Offset Correction

SOLVER FOR HARDWARE BASED COMPUTING

STATEMENT OF GOVERNMENT INTEREST

This invention was reduced to practice with Government support under Grant No. DE-FG02-03CH11171 awarded by The Department of Energy; the Government is therefore entitled to certain rights to this invention.

BACKGROUND OF THE INVENTION

Field of the Invention

The current invention is related to a programmable linear algebraic solver for large sparse matrices based on a lower-upper triangular decomposition method to be used in a hardware computing environment. Furthermore, the present invention also relates to models for power system components and power systems.

Brief Description of the Prior Art

Currently, power flow computation for large power systems is time intensive. The calculations are non-linear in nature and lengthy iteration schemes are the currently preferred solution. This presents a problem as many assumptions and simplifications are required to solve the equations in a timely manner. In addition, expansion of the power grid, increasing necessity and complexity of contingency studies and introduction of economic analysis are demanding further computational burden. Traditional digital methods are too slow to solve the aforementioned demands quickly. This affects the security, reliability and market operation of power systems. Ideally a real-time computation tool is preferable, specifically in market activities and operation.

In power flow computations, sparse linear solvers are used to calculate the update vector for the Jacobian matrix at each iterative step during Newton-Raphson iteration for load flow solution. The bottleneck in Newton power flow iteration is the solution of a sparse system of linear equations, which is required for each iteration, and typically consumes 85% of the execution time in large-scale power systems [1]. In practice, many related load flow computations are performed as part of contingency analysis. These multiple load flow computations can easily be performed in parallel. It remains desirable to speed up the computation of an individual load flow computation. Typical power flow computation is performed using general-purpose personal computing platforms based on processors such as the Intel Pentium IV®. High performance uniprocessor sparse linear solvers on these platforms utilize only roughly 1-4% of the floating-point throughput. Attempts have also been made to increase performance through the use of cluster computing [1], however, due to the irregular data flow and small granularity of the problem these methods do not scale very well.

Analog computation provides a viable alternative to traditional approaches. Among the advantages over traditional digital methods are physically realizable solutions and faster computation times. In order to make the analog method a viable tool in power system analysis, accurate models of power system components are required. A reconfigurable transmission line model is considered for a specific analog computation method. Traditional digital methods are expensive and slow in comparison to analog computers. The power flow solution is obtained almost instantaneously regardless of the number of components in the network with analog circuits. Essentially computation time is independent of network size. Effectively the solution is obtained as quickly as the system stabilizes. Experimentation has shown the ability to calculate solutions even faster than real time. In prior research, simulation time for a two-machine system was typically 104 times shorter than the real time simulated phenomena [101]. This is achieved by modeling generator dynamics for the purpose of transient stability evaluation.

The modeling and design of analog components is one obstacle that must be overcome. The solutions will only be as accurate as the models and measurements will allow. Without clearly defined valid models for power system components, the analog computational method will never be realized. In addition, these models also must cater towards computational speed. Specifically, in power system operation, multiple runs and contingencies are required to be executed extremely quickly. A priority for these analog models is to yield valid solutions while allowing fast reconfigurability.

An efficient strategy for designing analog emulation engines for large scale power system computation may be provided through the use of Analog Behavioral Models (ABMs) of PSpice [201]. Emulation can be described as an act of a physical system imitating a real system. Emulation in this patent application, therefore, is the representation of physical characteristics of a real life object (power system) using an electric circuit equivalent. The representational relationship could be mathematical, scaled, or both. The circuit equivalent representation has within it the model of a real system as well as a method of its solution. The speed of computation is as quick as the response of the circuit itself, which could be real time, faster or slower than real time depending on the parameter settings. The solution is continuous in time and amplitude.

Simulation on the other hand is an attempt to predict/replicate aspects of the behavior of a real system by creating an approximate (mathematical) model of it. Computer modeling, for example by providing a special-purpose computer program, may do this. The program is composed of equations that describe the functional relationships within the real system. When the program is run, the resulting mathematical dynamics form an analog of the behavior of the real system with the results presented in the form of data.

The need to emulate/simulate large and complex mixed-signal systems has prompted the development of high-level circuit representations for analog components; ABMs serve this purpose. The interior of a behavioral model, however, is different in that it is implemented in terms of algebraic or differential equations rather than physical analog components. In order words, in a behavioral model, the focus is on the input/output relationship of the block. The fundamental advantage of the behavioral modeling technique in top-down designs is that the simulation can provide fast prediction of system performance. The approach helps to select proper architectures for circuit implementation and analyze tradeoffs at the early design stages. The transistor level simulation (bottom-up design), comparatively, can be very tedious and cumbersome especially for mixed-signal chips containing a large number of analog components. Under such circumstances, behavioral models enable designers to verify the complex system efficiently and result in fast system evaluation prior to embarking on full structural design and implementation.

Static load flow analysis, which is based on the power flow equations, is one method currently used by the industry. The problem is that suchanalyses solve using a sequential method, which makes the simulation process very slow in complex networks. The speed of the digital computer to solve for static load flow is greatly dependent on the size of the power system network. An alternative method to solve static load flow is using an analog computer to emulate the behavior of the power system, instead of using model equations to simulate the network.

In the past two decades, silicon-on-insulator (SOI) complementary metal oxide semiconductor (CMOS) technology has become a major technology for integrating VLSI systems using a low-supply voltage [301]. Along with the progress in the CMOS technology, CMOS devices have been scaled down continuously and the corresponding power consumption has also been decreased, which have triggered advances in the circuit design techniques for various designs and applications. The association between CMOS circuits and VLSI chips is becoming increasingly easier to implement.

With these advances, Fried et al. [302], proposed an approach using an analog VLSI chip for simulation of the behavior of power systems. Using an analog VLSI chip can be limited if the fabricated chip is only useful for one power system configuration. Gu et al. [303], presented a concept to add reconfigurable parameters using switches and analog voltages to change the system configuration and parameters.

SUMMARY OF THE INVENTION

According to one aspect of the current invention, the system provides a substantially improved computing platform for solving computation intensive problems. One implementation includes Field Programmable Gate Arrays (FPGA) for the solution of sparse linear systems.

According to a second aspect of the current invention, the system is implemented by a combination of downloadable core software and a dedicated hardware such as FPGA. The core software customizes the application of the FPGA for various computational analyses.

According to a third aspect of the current invention, a static transmission line is modeled for analog power flow computation. Operational transconductance amplifiers in the model provide reconfigurability of transmission line parameters via transconductance gain.

According to a fourth aspect of the current invention, Analog Behavioral Models (ABMs) are implemented for use in analog emulation engines for large-scale power system computation. ABMs are applied for model verification and validation prior to full structural design and implementation.

According to a fifth aspect of the current invention, a generator model using analog circuits is developed for load flow emulation for power system analysis to reduce computation time. The generator model may include reconfigurable parameters using operational transconductance amplifiers (OTAs). The circuit module is used with other reconfigurable circuits, i.e., transmission lines and loads.

BRIEF DESCRIPTION OF THE DRAWINGS

FIG. 1 is a diagram illustrating SYMAMD elimination row histogram.

FIG. 2 is a diagram illustrating the architecture of one preferred embodiment according to the current invention.

FIG. 3 is a diagram illustrating the pivot search logic block of one preferred embodiment according to the current invention.

FIG. 4 is a diagram illustrating the update pivot column/row read logic block of one preferred embodiment according to the current invention.

FIG. 5 is a diagram illustrating the update unit of one preferred embodiment according to the current invention.

FIG. 6 is a graph illustrating the relation between the increased speed and the number of update units according to the current invention.

FIG. 7 is a graph illustrating the relative solve times for a single update unit according to the current invention.

FIG. 8 is a graph illustrating the relative solve times for sixteen update units according to the current invention.

FIG. 9 is a graph illustrating the LU hardware performance relative to a Pentium IV® processor.

FIG. 10 is a circuit diagram illustrating a DC network emulation for a three-bus power system.

FIG. 11 is a diagram illustrating a lossy transmission line model.

FIG. 12 is a diagram illustrating a lossless transmission line model.

FIG. 13 is a diagram illustrating an ideal operational transconductance amplifier (OTA).

FIG. 14 is a diagram illustrating a double ended OTA transmission line model.

FIG. 15 is a diagram illustrating a potentiometer relationship to OTA model.

FIG. 16 is a diagram illustrating PSpice schematic for bias current control.

FIG. 17 is a graph plotting bias current vs. bias voltage.

FIG. 18 is a graph plotting theoretical and simulated resistance vs. bias voltage.

FIG. 19 is a graph plotting line current vs. line voltage.

FIG. 20 is a graph plotting line current vs. line voltage linear region.

FIG. 21 is a graph illustrating effective resistance of line model.

FIG. 22 is a graph plotting effective resistance of line model vs. line voltage.

FIG. 23 is a graph plotting hardware and spice effective resistance vs. bias voltage.

FIG. 24 is a graph plotting HW line current vs. line voltage for various bias currents.

FIG. 25 is a graph illustrating line current linearity.

FIG. 26 is a graph plotting HW resistance vs. line voltage.

FIG. 27 is a diagram illustrating a three-bus power system topology.

FIG. 28 is a diagram illustrating a three-bus prototype board.

FIG. 29 is a diagram illustrating an emulation circuit setup.

FIG. 30 is a diagram illustrating a power world power flow solution.

FIG. 31 is a diagram illustrating analog and ABM sine shaper.

FIG. 32 is a time line of hardware technology.

FIG. 33 illustrates complex computation methodology.

FIG. 34 is a diagram illustrating a complex computation implementation.

FIG. 35 is a diagram illustrating generator real power computation methodology.

FIG. 36 is a diagram illustrating computationally feasible bus voltage.

FIG. 37 illustrates variable representation in analog emulator.

FIG. 38 is a diagram illustrating a power system emulator hardware setup.

FIG. 39 is a diagram illustrating a classical generator model.

FIG. 40 is a block diagram illustrating a swing equation functional block.

FIG. 41 is a block diagram illustrating generator model functions.

FIG. 42 is a diagram illustrating a single-machine CMON analog emulator.

FIGS. 43a-b show diagrams illustrating results of power system and analog emulator.

FIG. 44 is a diagram illustrating results of analog emulator with offset corrections.

DETAILED DESCRIPTION OF THE PREFERRED EMBODIMENTS

In the current invention, application-specific hardware is employed to reduce the computation time for the solution of the sparse linear systems arising in complex computations. The use of special-purpose hardware reduces the overhead costs, better utilizes floating-point hardware, and provides fine-grained parallelism. The use of Field Programmable Gate Arrays (FPGA) provides a convenient platform to design and implement such hardware. By building hardware that is specifically designed to solve the sparse matrices found in complex calculations, such as power system calculations, rather than utilizing general-purpose processors and parallel processing, the present invention significantly improves the efficiency of the linear solver and hence reduces the computing time compared to traditional platforms.

Thus, one aspect of the present invention relates to hardware for the direct solution of sparse linear systems. The hardware design takes advantage of properties of the matrices arising in the specific computation obtained from a detailed analysis of actual systems.

Overview of FPGA Technology

Field programmable gate arrays (FPGA) are reconfigurable logic devices that allow users to configure device operation through software. Arrays of programmable logic blocks, combined with programmable I/O blocks, and programmable interconnects form the underlying reconfigurable fabric for FPGAs. Software code, typically written in a hardware description language (HDL) such as VHDL or Verilog, is mapped to these devices allowing the user to specify the functionality of the FPGA. FPGAs can be programmed multiple times, unlike other programmable logic devices (PLD), which can only be programmed once. In addition, unlike application specific integrated circuits (ASIC), there is not a long lead time in between design and testing since the designer does not have to wait for masks and then for manufacturing to return a part for test. The user simply compiles the design for the desired FPGA and then programs the device.

FPGA device densities are in the millions for logic gates with clock rates of 500 MHz for synthesized logic (see www.xilinx.com). Beyond increases in logic density, the addition of high performance embedded arithmetic units, large amounts of embedded memory, high speed embedded processor cores, and high speed I/O has allowed FPGAs to grow beyond just simple prototyping devices. FPGAs can outperform high-end personal computers [3]. Based on synthesis results, a high-end FPGA such as a Xilinx Virtex-4™ contains enough embedded multiplier and logic resources to support over 40 high-speed single precision floating-point multipliers operating at 300 MHz. Unlike personal computer processors, FPGAs have the advantage of being able to be mapped to the desired application, rather than being designed to perform well across a wide range of applications. This allows the greatest amount of utilization of the available resources on the FPGA.

Overview of Power Flow by Newton's Method

The present invention will be exemplified based on power flow computation. However, the present invention is applicable to other types of complex computations as well.

Power flow solution via Newton's method [4] involves iterating the following equation:

$$-J \cdot \Delta x = f(x) \quad (1)$$

Until $f(x)=0$ is satisfied. The Jacobian, J, of the power system, is a large highly sparse matrix (very few non-zero entries), which while not symmetric has a symmetric pattern of non-zero elements. $\Delta x$ is a vector of the change in the voltage magnitude and phase angle for the current iteration. And $f(x)$ is a vector representing the real and imaginary power mismatch. The above set of equations are of the form $Ax=B$, which can be solved using a direct linear solver. Direct linear solvers perform Gaussian Elimination, which is performed by decomposing tithe matrix A into Lower (L) and Upper (U) triangular factors, followed by forward and backward elimination to solve for the unknowns.

Dense matrix linear solvers are not as efficient as specialized solvers designed for sparse matrices. These solvers do not compute the non-zero entries. However, they suffer from a phenomenon known as fill-in. Fill-in of a sparse matrix during LU decomposition arises when a previously zero entry in the matrix becomes non-zero during the elimination process. Large amounts of fill-in will degrade the performance of sparse solvers by increasing the number of mathematical operations required for the LU decomposition. By using an appropriate elimination order, the amount of fill-in can be dramatically reduced [5]. Selecting the optimal ordering is an NP complete problem [6]. However, effective heuristics are known that work quite well for the matrices in load flow computation. In addition, sparse matrix solvers do not share the regular computational pattern of dense matrix solvers and as a consequence there is significant overhead in accessing and maintaining data structures that utilize the sparse data.

Benchmark System and Properties

An in-depth analysis of the elimination process was performed using four power systems of various sizes. Two of the systems, the 1648 Bus and 7917 Bus systems, were obtained from the PSS/E data collection, and the other two systems, the 10279 Bus and 26829 Bus systems, were obtained from power systems used by PJM Interconnect. The purpose of the analysis was to obtain features of the systems arising in typical power system computation that could be utilized in the design of special-purpose hardware. In addition, the systems were also used to benchmark the proposed hardware and compare it against a state-of-the art software solution. Table 1 summarizes the number of branches and number of non-zeros (NNZ) in the Ybus matrices and the size and number of non-zeros of typical Jacobian matrices for the benchmark systems.

TABLE 1

Summary of Power System Matrices

| System | Branches | NNZ YBUS | NNZ Jacobian | Jacobian Size |
|---|---|---|---|---|
| 1648 Bus | 2,602 | 6,680 | 21,196 | 2,982 |
| 7917 Bus | 13,014 | 32,211 | 105,522 | 14,508 |
| 10279 Bus | 14,571 | 37,755 | 134,621 | 19,285 |
| 26829 Bus | 38,238 | 99,225 | 351,200 | 50,092 |

Operation Count (Opcounts) and Fill-In Study

The number of floating-point subtractions (FSUB), multiplications (FMUL), divisions (FDIV), and the growth of the matrices as a result of fill-in were collected for the Jacobians and are summarized in Tables 2 and 3. This information was used to project performance and estimate storage requirements for the resulting L and U factors. The MATLAB functions COLAMD and SYMAMD were used to determine elimination ordering. The number of fill-ins is equal to the number of non-zeros in the L and U factors compared to the Jacobian. SYMAMD utilizes the symmetric structure of the non-zeros in the Jacobian and provides a substantial reduction in fill-in and arithmetic operations.

TABLE 2

COLAMD NNZ and MFLOP Count

| System | NNZ LU | # FDIV | # FMUL | # FSUB |
|---|---|---|---|---|
| 1648 Bus | 82,378 | 0.039 | 1.088 | 1.027 |
| 7917 Bus | 468,757 | 0.225 | 9.405 | 9.041 |
| 10279 Bus | 450,941 | 0.206 | 6.267 | 5.951 |
| 26829 Bus | 1,424,023 | 0.661 | 40.110 | 39.037 |

TABLE 3

SYMAMD NNZ and MFLOP Count

| System | NNZ LU | # FDIV | # FMUL | # FSUB |
|---|---|---|---|---|
| 1648 Bus | 45,595 | 0.021 | 0.268 | 0.243 |
| 7917 Bus | 236,705 | 0.110 | 1.737 | 1.606 |
| 10279 Bus | 293,688 | 0.130 | 1.976 | 1.817 |
| 26829 Bus | 868,883 | 0.392 | 11.223 | 10.705 |

Given a floating point throughput limited calculation, the performance is proportional to the number of floating point operations (FLOPs) divided by the throughput of the floating-point hardware. Based on the flop counts and a throughput of 200 million floating point operations per second (MFLOPs), the projected solve time for the largest system is approximately 0.11 seconds, solved using the SYMAMD pre-permutation.

The storage requirement for the L and U factors is proportional to the number of non-zero elements for a non-restoring design, where the original inputs are overwritten by the resulting solution. A sparse matrix storage scheme is much more space efficient than dense storage when dealing with matrices of large size, but very few non-zero values. Row compressed storage is a common method used by sparse solvers [7]. This scheme stores the non-zero values of a sparse matrix by a set of row vectors, one vector containing non-zero values and the other containing the corresponding column indices. Assuming 32-bit indices and 32-bit values for the matrix entries, the amount of storage required to store the L and U factors is approximately 7 MB for the largest test system, solved using the SYMAMD pre-permutation. This amount of storage is well within the space available on off the shelf memory chips (www.micron.com).

Elimination Details

The pattern of non-zero elements that arise during the elimination process was analyzed in order to estimate the available parallelism, intermediate storage requirements, and potential for data reuse.

Table 4 shows the average number of non-zero elements in the rows and columns of the matrix as the elimination process proceeds. It is used as an estimate for the amount of row or column parallelism (separate rows can be updated in parallel) that can be achieved by utilizing multiple FPUs. Observe that the reduced fill-in obtained by SYMAMD leads to reduced parallelism. The amount of resources on an FPGA can support the number of floating-point units required to achieve maximal parallelism.

FIG. 1 shows the distribution of the number of non-zero entries in the rows that occur during the LU factorization for the 1648 Bus system. The x-axis is the number of non-zeros and the vertical bars indicate the number of rows with that many non-zero entries. The bulk of the elimination rows are at or below the average. This histogram is representative of all of the row and column results for both COLAMD and SYMAMD across all four benchmark systems.

The maximum number of non-zero elements in a row determines the size of buffers that store rows. Table 5 shows the maximum NNZ in a row for the entire row as well as the portion of the row used during elimination (Table 5). Using 32-bit indices and 32-bit floating point values, 19K bits of storage is required for the largest elimination row of the 26829 Bus system. Today's FPGAs contain thousands of Kbits of high speed embedded memory, which is enough to buffer hundreds of rows or columns.

TABLE 4

Mean elimination row and column size

| | COLAMD | | SYMAMD | |
|---|---|---|---|---|
| System | Row | Col | Row | Col |
| 1648 Bus | 13.4 | 14.2 | 7.2 | 8.1 |
| 7917 Bus | 15.8 | 16.5 | 7.8 | 8.6 |
| 10279 Bus | 11.7 | 11.7 | 7.5 | 7.85 |
| 26829 Bus | 14.2 | 14.2 | 8.5 | 8.9 |

TABLE 5

Maximum elimination row and matrix row size

| | COLAMD | | SYMAMD | |
|---|---|---|---|---|
| System | Elim. | Matrix | Elim. | Matrix |
| 1648 Bus | 90 | 231 | 66 | 218 |
| 7917 Bus | 147 | 477 | 125 | 275 |
| 10279 Bus | 116 | 416 | 186 | 519 |
| 26829 Bus | 258 | 886 | 293 | 865 |

The amount of reuse between subsequent elimination rows impacts the potential efficiency of a memory hierarchy. Rows that are reused from one iteration to the next can be cached and a row not used in the previous iteration can be prefetched. Rows reused in subsequent eliminations do not allow pivot search to occur in parallel with computation during elimination since some values being calculated are necessary for the next pivot search. Table 6 shows that slightly more than half of the rows are reused between subsequent iterations.

TABLE 6

Mean Percentage of Non-Zero Row Elements Reused between Successive Elimination Rows

| System | COLAMD | SYMAMD |
|---|---|---|
| 1648 Bus | 64% | 53% |
| 7917 Bus | 64% | 54% |
| 10279 Bus | 60% | 54% |
| 26829 Bus | 60% | 54% |

Software Performance

The comparison system used in the benchmarks is a 2.60 GHz Pentium IV® computer running Mandrake Linux 9.2™. Software was compiled using gcc v3.3.1 (flags-O3-fPIC) and utilizing ATLAS CBLAS libraries. Three high-end sparse solvers were tested, UMFPACK (Un-Symmetric Multi-Frontal Package) [8], SuperLU (http://www-.cs.berkeley.edu/~demmel/SuperLU.html), and WSMP (Watson Sparse Matrix Package: http://www-users.cs.umn-.edu/~agupta/wsmp.html). Of the three solvers, UMFPACK gave the best results on all four systems. The numerical solve time, floating point operations per second, and floating point efficiency of the comparison system were gathered using the power system matrices. Despite the 2.6 GHz clock speed and impressive computational power of the Pentium IV® benchmark system, even the highest performance software was only able to utilize a fraction of the total available floating-point resources.

TABLE 7

Comparison System Benchmarks

| Data Name | UMFPACK Numeric Factor time (s) | Mflops re-ported by UMFPACK | Efficiency % (obtained flop * 100/peak flop) |
|---|---|---|---|
| 1648 Bus | 0.03 | 27.42 | 1.05 |
| 7917 Bus | 0.13 | 34.69 | 1.33 |
| 10278 Bus | 0.16 | 24.9 | 0.96 |
| 26829 Bus | 0.49 | 89.74 | 3.45 |

Hardware Design

The proposed hardware implements the Gaussian elimination with partial pivoting LU factorization algorithm shown below:

```
For each column in the matrix loop
    Search column for pivot element
    Pivot if necessary
    Normalize pivot column
    Update remaining portion of matrix:
        Multiply to form sub-matrix update
        Update value or create fill-in
End loop
```

In order to maximize performance, the design of the LU hardware focused on maintaining regular computation and memory access patterns that are parallelized wherever possible. FIG. 2 shows a block diagram of the overall design of one preferred embodiment according to the current invention. The Pivot Search Logic, Update Pivot Column/Row Read Logic, and Update Unit Logic blocks each perform a portion of the overall LU algorithm, with control and memory access handled by the other two blocks on the FPGA. The memory hierarchy to which the processing logic connects, consists of a write-back row-cache implemented in a fast random-access memory such as SRAM, as well as a larger block of SDRAM which is used to store the matrix rows which do not fit into the row cache. Our design makes full use of Dual-Ported SRAM memories which allow memory reads and writes to occur simultaneously. An additional bank of random-access memory is also required to store the colmap. The colmap is a redundant column-wise array of the indices of non-zero elements in the matrix. The purpose of the colmap is to increase the efficiency of the pivot search.

The minimum size of the row cache is equal to the amount of memory required to store the largest sub-matrix update, which is proportional to the product of the maximum number of non-zero elements in an elimination row and the maximum number of non-zero elements in an elimination column. A cache of this size insures that all row writes for a given sub-matrix update will be cache hits and will occur at cache speed, since all row misses will only occur during pivot search insuring row availability during sub-matrix update. The parameters to calculate the amount of cache required was extracted as previously described under Elimination Details.

For the initial design, the cache row size, SDRAM row size, and colmap row size exceed the maximum counts, which were extracted during the initial matrix profiling. This insures that the memories will have enough space to store the worst case, however, this also means that there will be inefficiencies in the storage for the typical case.

Not shown in the hardware diagrams are the facilities required to maintain row pivoting information, which is implemented by lookup tables and memory pointers, which keep track of the row to memory mappings for the compressed row storage format. An additional table is used to keep track of elimination progress to avoid reading row values that are not part of the sub-matrix update, i.e., elements that have already been eliminated. The size of these lookup tables scales linearly with matrix size. Depending on the size of the matrices to be solved and the available on-chip resources, these tables can be stored in embedded memory on-chip or if they are larger, in off-chip memory.

Pivot Search Logic

Now referring to FIG. 3, the pivot search logic block performs the pivot search prior to each sub-matrix elimination step. A memory read of the column map followed by indexing logic creates the indices for the pivot column. The column map stores the physical address of rows in a particular column. The physical address must then be translated to the corresponding matrix row number. Since the colmap may contain rows which have already been eliminated, index rejection logic is required to select the appropriate indices. The physical addresses corresponding to these indices are then used to access the values from memory. The values are compared sequentially as they arrive to obtain the absolute maximum value and index. This value is stored in a register as the pivot element. The physical indices, virtual indices, and floating-point values for the pivot column are also stored in registers to be used by the pivot column update logic. The minimum amount of memory required for these registers is equal to the product of the largest elimination column in the matrix and the amount of storage for two indices and one value. After pivoting is complete, a background update is sent to lookup tables (not shown) to maintain the correct row and address mappings for future translations.

Update Pivot Column/Row Read Logic

Now referring to FIG. 4, the update pivot column/row read logic block performs normalization prior to elimination in parallel with the pivot row requested from memory. The pivot index, pivot value, and pivot column are from the pivot search logic (FIG. 3). After the pivot row is completely read from memory into buffers, and at least one of the update column entries has been created the next part of the elimination logic can proceed. Since the design utilizes a floating-point divider with a pipeline rate of 1 per clock cycle, all of the remaining divides will complete before they are requested by the update unit logic. The update row indices and values, and the normalized update column indices (physical and virtual) and values are stored in registers. The minimum size of this register space is equal to the product of the maximum elimination row in the matrix and the amount of space required to store three indices and two values.

Update Unit Logic

Now referring to FIG. 5, the update unit logic performs the remaining computations required during the elimination step. In this design, the processing logic can support multiple update units operating in parallel. Each update unit is tasked with completing the elimination for a single row of the sub-matrix to be updated. Each update unit contains a floating-point multiplier and adder to perform the required arithmetic as well as other logic that operates on the column indices. The computational logic operates in parallel with the memory and indexing logic to maximize utilization of all of the logic units. The number of update units that can fit on the FPGA is limited by the amount of on-chip embedded memory available, the number of multipliers available, and also the available logic resources. A high end FPGA has enough resources to support over 16 of these units.

The merge logic maintains the row order and also determines if the multiplier output is a fill-in, an update, and also determines if the sub-matrix row element should be copied into the new row. If an entry is a fill-in, the colmap table is updated in the background to reflect the newly added index. Updates that result in a zero value are not pruned from the colmap and they are also stored in the row result. All logic in the update unit is pipelined for maximum throughput. Once the front end of the update unit has completed processing, it can request the next available row to be operated on in order to eliminate idle logic cycles. After all of the pending row eliminations for the current sub-matrix update have been completed, the next pivot search can begin.

Hardware Performance Model

A program was written in C, to project the performance of the hardware design. This program performs the elimination in the same fashion as the hardware would, and operates on an input file that contains the power system Jacobian matrix. The number of clock cycles the hardware requires to obtain the L and U factors is accumulated based on the latency and throughput of the processing logic and memory hierarchy. This cycle count allows us to compute the computation time based on clock speed.

TABLE 8

Solve time for LU Hardware

| System | Update Units Solve Time (s) | | | | |
|---|---|---|---|---|---|
| | 1 | 2 | 4 | 8 | 16 |
| 1648 Bus | 0.0041 | 0.0028 | 0.0021 | 0.0018 | 0.0017 |
| 7917 Bus | 0.0243 | 0.0157 | 0.0116 | 0.0097 | 0.0090 |
| 10279 Bus | 0.0311 | 0.0202 | 0.0149 | 0.0126 | 0.0117 |
| 26829 Bus | 0.1378 | 0.0817 | 0.0543 | 0.0415 | 0.0359 |

The memory model used for accessing SDRAM utilized three parameters to model the average behavior of a SDRAM memory: verall latency, burst read length, and latency between bursts. For the SRAM and embedded memories the model parameter was latency from request to data output. The only parameter for the floating-point hardware is the pipeline length, which affects the latency of results. All units were assumed to have a pipeline rate of 1 per clock cycle, even the floating-point division hardware. Extending the model to multiple instances of update unit logic was done by simulating round-robin service for each update unit by the memory hierarchy assuming a proportional increase in bandwidth. The clock rate for memory and logic was assumed to be synchronous at 200 MHz. This system clock rate was chosen because this was the maximum clock rate reported by VHDL synthesis for our floating-point units.

Table 8 shows the projected performance of the proposed LU hardware architecture based on the four test power systems using the SYMAMD pre-permutation at a clock rate of 200 MHz. The simulated hardware performance achieves approximately 80% of the performance predicted by opcount. The projected performance using COLAMD (not shown) is less than SYMAMD, regardless of the number of update units used. FIG. 6 shows the relative speedup of the LU hardware by increasing the number of update units. Scaling to even four update units does not net an equivalent speedup in overall solve time. The reason for this is apparent in FIGS. 7 and 8.

FIGS. 7 and 8 show the relative time spent in the three portions of the LU hardware solution. For the single update unit configuration (FIG. 7), the majority of the time is spent performing the matrix update. Roughly a quarter of the time is spent searching for the pivot value. A FIG. 8 show that as the number of update units increases, the amount of time spent during pivot searching begins to dominate the overall solve time.

FIG. 9 shows the predicted performance ratio of performance of the LU hardware at 200 MHz to the Pentium IV® benchmark system. This data predicts a speedup over the Pentium IV® of a factor of 10 with only 4 update units and approximately 15 with 16 units.

These results show that special-purpose hardware implemented using existing FPGA provides a 10× or higher performance increase, compared to software solutions using state-of-the-art sparse linear solvers, for the LU decompositions that arise in typical power flow computations. The speedup is obtained by utilizing special-purpose hardware to reduce the overhead to access and maintain data structures for sparse matrices and the use of fine-grained parallelism which performs multiple row updates in parallel. The reduction in overhead dramatically improves the utilization of the floating-point units as compared to software solutions on general-purpose processors.

A limiting factor is the time for pivot search. Eliminating or reducing the pivot search time will result in additional gains in performance. Such improvement may be obtained by overlapping the next pivot search with the current update, however, this is limited by the amount of reuse in rows from one elimination step to the next. The use of other approaches such as the Bordered Diagonal Block (BDB) technique may provide additional parallelism.

Analog Power Flow Method

A DC emulation power flow method has been proposed in [102] and is reviewed here for an understanding of the application of the line model in this invention. This approach utilizes multiple DC networks as shown in FIG. 10. The power system is broken up into three main components: generators, transmission lines, and loads. The generators are shown as voltage sources. This form of DC emulation is possible due to the fact that the emulation is executed in rectangular coordinates. The generators excite the network with real (Re{$E_g$}) and imaginary (Im{$E_g$}) voltage components and the states (voltages and currents) of these networks provide the steady-state power flow solution. The transmission line components in this emulation scheme are purely resistive and the imaginary resistor values are dependant upon operating frequency. By modeling as fixed resistors the frequency is assumed to be constant.

The current flowing out of a given generator i is calculated using the following equation [103]:

$$I_{Gi} = \sum_{j=1}^{n} \text{Re}\{Y_{ij}\} \cdot \text{Re}\{E_j\} - \quad \text{network 1} \quad (2)$$

$$\sum_{j=1}^{n} \text{Im}\{Y_{ij}\} \cdot \text{Im}\{E_j\} + \quad \text{network 2}$$

$$j\sum_{j=1}^{n} \text{Im}\{Y_{ij}\} \cdot \text{Re}\{E_j\} + \quad \text{network 3}$$

$$j\sum_{j=1}^{n} \text{Re}\{Y_{ij}\} \cdot \text{Im}\{E_j\} \quad \text{network 4}$$

This approach accurately models and calculates power flow for a lossy transmission network with the assumption that there is no frequency deviation from nominal. A lossy transmission line model is emulated composed of both reactive and resistive elements as shown in FIG. 11.

Relating the emulation circuit to the real world power system determines the real and imaginary resistor values in the DC networks. The following governs this [104]:

$$R_{Re(ij)} = \frac{1}{\text{Re}\{Y_{ij}\}} = \frac{R_{ij}^2 + X_{Lij}^2}{R_{ij}} \quad (3)$$

$$R_{Im(ij)} = \frac{1}{\text{Im}\{Y_{ij}\}} = \frac{R_{ij}^2 + X_{Lij}^2}{X_{Lij}} \quad (4)$$

where $R_{ij}$ and $X_{ij}$ are the resistance and reactance of a line between buses i and j. The same approach is used for lossless transmission lines. The transmission line resistances are neglected as shown in FIG. 12. The topology is similar to FIG. 10 with the exclusion of networks 1 and 4. Similarly, it is solved by omitting the excluded networks.

The general layout for the DC emulation approach has been provided along with a relationship between AC lumped line models and the DC networks. With this information, an operational transconductance amplifier (OTA) based transmission line model with reconfigurability was developed explicitly for the DC emulation power flow method.

Transmission Line Model

The transmission lines were modeled as resistors in the DC emulation shown previously for both lossy and lossless lines. Actual use of resistors would require manual intervention to configure and alter the analog system. In order to overcome this problem, a remotely reconfigurable OTA based variable resistor was developed to model the lines.

The transconductance gain ($g_m$) of an OTA is controllable through an external source over a wide range, allowing remote reconfigurability. In addition, the basic OTA only consists of a few current mirrors resulting in a small and relatively low-cost device. They are also readily used in VLSI design. Due to its versatility, the OTA is one of the most important building blocks of analog VLSI circuits [105] and can be highly accurate if used properly. Some of the pitfalls of OTAs are their sensitivity to temperature and saturation effects but there are methods to correct these [106, 107]. The principle operation of an OTA is a voltage controlled current source (VCCS). FIG. 13 shows an ideal OTA.

The amplifier has a differential voltage input and a current output. The current output is related to the differential input through a transconductance gain ($g_m$) controllable through an external source. Ideally the output would be:

$$i_{out} = g_m v_{in} \quad (5)$$

where $v_{in}$ is the differential input voltage.

With VCCS operation, the OTA naturally lends itself to an application of a variable resistor. The proposed OTA based variable resistor is shown in FIG. 14. It consists of two OTAs to address bi-directional current flow. When current is flowing from left to right, the OTA on the right is supplying the current, conversely if current is flowing in the opposite direction. The inputs are floating with respect to the power supply and feedback is incorporated to extend the linear operating range of the device.

FIG. 14 illustrates a double-ended OTA transmission line model [108]. This line model has three terminals similar to a variable resistor. The two inputs ($V_1$, $V_2$) mimic terminals of a resistor and the $i_{abc}$ is the biasing current used to control the resistance of the model similar to the wiper on a potentiometer. The terminal relationship to a potentiometer is shown in FIG. 15.

The effective resistance, Reff, of the OTA model is defined as the resistance seen between terminals $V_1$ and $V_2$. Reff is governed directly by Ohm's law through the line voltage ($V_{line}$) and the line current ($I_{line}$).

$$R_{eff} = \frac{|V_1 - V_2|}{I} = \frac{V_{line}}{I_{line}} \quad (6)$$

This effective resistance is controlled by the bias current and approximated by the following equation:

$$R_{eff} \approx \frac{2 \cdot R}{g_m \cdot R_A} \quad (7)$$

The sizing of resistors R and $R_A$ along with the range of transconductance gain will determine the behavior of the circuit. With appropriate resistors and wide control over gain a very large range of effective resistance is obtainable. The limitations of the circuit are related to properties of OTAs. The limitations, operation and controllability were analyzed through PSPice simulations and hardware testing.

Simulation

A LM13700 dual OTA was used for the simulations in PSPice. Various simulations were run to validate and characterize the line model. Controllability, resistance variance and circuit limitations were analyzed. The first simulation dealt with controlling the circuit through the bias current. Applying a current source is not as simple and easily controllable in comparison to a voltage source. The simulation using the circuit in FIG. 16 uses a voltage source ($V_{abc}$) behind impedance ($R_{abc}$) to drive the bias current.

A voltage sweep was performed on $V_{abc}$ and the corresponding bias current produced was measured. The relationship between bias voltage and $i_{abc}$ is differentiable until $i_{abc}$ approached zero as shown in FIG. 17.

From these results, the following relationship between $V_{abc}$, $R_{abc}$ and $i_{abc}$ was formed:

$$i_{abc} = \frac{1}{2} \cdot \left( \frac{V_{abc} + 13.56}{R_{abc}} \right) \qquad (8)$$

This approximation is close to the simulation results deviating only as the bias current becomes very close to zero. This is due to a non-linear roll-off of the bias current when compared to the bias voltage applied. Reasonable accuracy is obtained from a ±10 Volt bias voltage.

The transconductance gain of a basic bipolar OTA is directly proportional to the bias current and is quantified by [109]:

$$g_m = \frac{i_{abc}}{2 \cdot V_T} \cdot sech^2\left(\frac{V_{in}}{2 \cdot V_T}\right) \qquad (9)$$

The gain in (9) is not linear, typical applications linearize $g_m$ around an operating point. The differential input of the OTA is limited within very small range to ensure accuracy of this linear approximation. The LM13700 OTA gain is also a hyperbolic function although it improves the linearity through the use of linearizing diodes. These diodes allow a larger swing of input voltage while maintaining linear behavior. The gain for this chip, factoring in the diodes, is approximated by (10) for a differential input voltage in the range of ±50 mV. This gain can directly control the effective resistance in (7).

$$g_m = \frac{i_{abc}}{2 \cdot V_T} \cdot sech^2\left(\frac{V_{in} \cdot D}{2 \cdot V_T}\right) \qquad (10)$$

where $V_T$=26 mV and D is a diode linearization constant.

A simulation was conducted where $V_{abc}$ was varied to change the effective resistance while holding the line voltage constant. FIG. 18 shows simulation and theoretical results from (7). The effective resistance was computed using (6). These results show the controllability of resistance over a wide.

More simulations were run to analyze the consistency of the resistance. While maintaining a constant bias current, the circuit was subjected to varying line voltages. FIG. 19 shows multiple sweeps of the line voltage with different bias currents. The plot shows line current vs. line voltage. For an ideal resistor, the slope of the resulting line should be constant.

As seen in FIG. 19, when the line voltage is between ±4 volts, the slope, or resistance, remains constant. Beyond that threshold the OTA begins to saturate. FIG. 20 shows the same plot zoomed in on the linear range.

The saturation of the circuit is dependant on two factors: the bias current and the throughput current. The effective resistance has a variance of ±2% with throughput current 40% or less of the bias current. Complete saturation occurs when the throughput current is equal to the bias current.

Further examination of FIG. 20 reveals an offset in the circuit behavior. The output of the circuit is nonzero when no voltage is applied to the input (one of the line terminals). This is problematic as the effective resistance of the circuit governed by Ohm's law is nonlinear. The computation of this resistance is shown in FIG. 21 and exhibits anomalous behavior.

The offset current present at the output of the OTA is almost entirely caused by the internal offset voltage of the OTA. This can be modeled in a similar manner as offset voltages of traditional op-amps. Specifically, a voltage source ($v_{off}$) at the input of the device is amplified to the output producing the offset ($i_{offset}$). For an OTA, this is quantified by (11).

$$i_{offset} = v_{off} \cdot sech^2\left(\frac{V_{in}}{2 \cdot V_T}\right) \qquad (11)$$

A method for eliminating an OTA input offset voltage has been proposed in [110]. This method is suitable for fabrication and quantifies and eliminates the offset for any gain configuration. An offset rejection of 40 dB was achieved in simulation [110]. With the recognition of sufficient offset cancellation, the data was corrected in a manner representing the elimination of the offset quantified by (11) to analyze the results with offset compensation. The corresponding results are much better. FIG. 22 shows effective resistance versus line voltage for various bias current setting corrected for the offset. The asymptotic behavior is eliminated and the resistance exhibits a variance of approximately 1% with a line voltage magnitude of 2.5 volts or less.

Hardware

The OTA based transmission line model was constructed in hardware using the LM13700 dual OTA and tested. Tests similar to the PSpice simulations were conducted. The effective resistance of the circuit was calculated from measurements while varying the bias voltage. The hardware exhibits similar controllable resistance as the software simulations with only slight deviation from simulation results as shown in FIG. 23. Analysis shows the offset voltage present in hardware is slightly higher, and subsequently closer to the data sheet specifications, than the PSpice model.

Multiple hardware tests were conducted to analyze the saturation effects of the circuit. The circuit was configured with a constant bias current and subjected to a varying line voltage. FIG. 24 shows results of these tests for eight different resistance configurations. The slope of plots is indicative of the effective resistance and is constant for a limited line voltage range before saturation sets in similar to the simulation results. Approximately the same variance of ±2% for line currents at 40% or less of bias current was exhibited in hardware. FIG. 25 shows line current and the linear characteristic of this line current plotted against line voltage. The response is very linear and deviates only slightly in this range. This linearity is exhibited in the effective resistance of the circuit.

The effective resistance is plotted against line voltage in FIG. 26. With the line voltage range between ±2.5 volts, the variance of the effective resistance was less than 1%. This is an accurate range for operation of this model. The line model becomes less accurate, saturation effects become more severe, as the line current magnitude approaches the bias current magnitude. The linear range for this model, defined by <1% variance, is quantified by the following relationship:

$$i_{line} \leq 0.3 \cdot i_{abc} \qquad (12)$$

Within device limitations, the line voltage can be any magnitude as long as the relationship in (12) is maintained. This is advantageous as the linear operating voltage range has been significantly increased from a basic open loop OTA with the use of feedback. This will allow easy measurement of the bus voltages in an emulation network.

The results from both simulation and hardware were very similar and verify the operation, control and linear operating conditions of the proposed OTA based transmission line model. A three-bus prototype was constructed and tested based on these results.

Three-Bus Prototype

A network module prototype of a three-bus power system was built based on the proposed transmission line model. This design was incorporated on a single circuit board containing the transmission line components of the four networks as shown in FIG. 10. It is suitable for both lossy and lossless models shown in FIGS. 11 and 12, respectively. The main purpose of this prototype was to validate the transmission line model application in the previously proposed DC emulation power flow technique [102]. The configuration of the power system is shown in FIG. 27.

The power system consists of one load, two generators and three transmission lines (A, B, C). Four independent networks containing three OTA based variable resistors were used in this emulation. The combination of these networks constitutes the complete transmission line model. The circuit board contains only the line models with terminals to attach generator and load models. The complete circuit board is shown in FIG. 28. The lines (A, B, C) are highlighted in the picture to show the relationship to the power system along with the labeling of the four networks in relation to FIG. 10. The input terminals for generators, loads, and power supply are also shown. For simplistic operation with fewer power supplies, all the bias currents are driven by the +15 volt supply. Configuration of the lines was accomplished by the respective values of $R_{abc}$. In addition, there are jumpers on the board that connect the transmission lines to the buses. Lines can be removed for contingency analysis or the network can be reconfigured with these jumpers. In addition, this design is scalable and subsequently larger power systems can be emulated with interconnection of multiple boards.

The network module was configured for power flow emulation. DC voltage sources were used as generators (values were obtained from a computed steady-state power flow solution) and the load was an OTA based constant current source. This is shown in FIG. 29. While this setup requires the prior knowledge of the generator bus voltages, the appropriate voltage on the load bus corresponding to the correct load currents is sufficient to verify the functionality of the network module. The results were compared to results from the PowerWorld® software package [111].

The network module was configured per the lossless system in PowerWorld® shown in FIG. 30. Table 9 shows the results, load bus voltage in per unit, from both the hardware (offset corrected) and the software computation.

TABLE 9

PowerWorld and HW Emulation Results

| | Load Bus Voltage | |
|---|---|---|
| | Rectangular | Polar |
| PowerWorld | 0.78 + 10.25 | 0.816∠17.48* |
| HW Emulation | 0.78 + 10.24 | 0.817∠17.35* |

The results in this case are very accurate. From multiple runs and different load configurations the voltage magnitude error between PowerWorld® and HW was approximately 1.5% and the phase angle error was about 5%. The errors are caused mostly by deviations from OTA to OTA and resistor tolerances.

The transmission line model presented is sufficient for lossy and lossless line models for use in the DC emulation static power flow technique mentioned. The overall model consists of multiple OTA based variable resistor circuits. The shortcomings of the hardware prototype, such as linear range, accuracy and device offsets, are mostly due to the current OTA technology. This can be overcome with further development of better performing OTAs, which have been shown in prior research, in a similar manner in which traditional op-amps have been developed. This problem can also be tackled through a custom VLSI design.

An accurate, low-cost and remotely reconfigurable OTA based analog transmission line model has been developed. Simulation and hardware results verified the design, clearly defined linear operating ranges and examined the deficiencies of current off-the-shelf OTAs while pointing out methods of compensation. A three-bus power system was constructed based on the proposed model and the resultant power flow results compared favorably to those from commercially available software. This expands on the work presented in [101-103] by the introduction of a hardware based line model with fast, remote reconfigurability suitable for the presented power flow emulation scheme.

In another preferred embodiment, simulation and/or emulation are used when dealing with large-scale power systems. They make it possible to do essential assessment in power system dispatch, operation, security and stability. Different simulation/emulation tools today are built for different applications like transient stability analysis, fault analysis, power flow studies, operational planning, etc.

ABMs are used to make flexible descriptions of electronic components or complex building block in terms of transfer function or lookup tables. In order words, a mathematical relationship is used to model a circuit segment so one will not need to design the segment component by component. FIG. 31 shows a sine shaper which is a device that outputs sine value of its input signal. The left side of FIG. 31 is a modified Barry Gilbert sine shaper [203] built component by component using analog devices, and the right side of FIG. 31 is an ABM sine shaper [201]. The only similarity between the two is that they both take the same input signal and produce the same output.

One aspect of the invention employs transient stability analysis with the advantages of shorter computation time than current digital simulations and smaller size and cost than discrete analog emulators. One of the main disadvantages of this method is the limited accuracy due to the implementation of the analog VLSI chip.

Methodology of Core Computations Using ABMs

Analog Behavioral Models (ABMs) of PSpice are used to substitute and implement mathematical equations and/or scaled relationship analog circuit representations, which describes the states of power system and emulate its behaviors. This gives a clearer picture of the end goal, design layouts and intricacies of circuit connections.

Power system core computation methodology implemented in the design of analog emulation goes through three major steps. These steps are illustrated in FIG. 32. The assumptions made and detailed processes are discussed in [211] and [202], respectively.

Step 1: Calculating Complex Voltage Out of Generator

The generator block solves the swing equation (dynamic) with resulting power angle, δ. The power angle combines with desired voltage magnitude to give a complex voltage out of a generator.

Step II: Calculating Currents in the Network

The nodal and generator induced voltages interact with transmission line impedance and load (if not lumped with line impedance) to produce complex current flowing in any branch. Using admittance for simplicity and expressing in rectangular form, current is computed as in FIG. 32. As depicted in FIG. 33, it will require four separate networks in order to emulate complex current flowing on any branch. The approach of DC-resistive network as proposed by Fried et al. [211] is used. Transformation of the transmission line complex impedance to its resistive value for real and imaginary part is through its complex conjugate as shown in equation 13:

$$\left. \begin{array}{l} Y = \dfrac{1}{Z} = \dfrac{1}{R+jX} = \dfrac{R-jX}{R^2+X^2} \\ Y_{Re} = \dfrac{R}{R^2+X^2} = Y_r \\ Y_{Im} = (-)\dfrac{X}{R^2+X^2} = Y_i \end{array} \right\} \quad (13)$$

Combining equation 13 with FIG. 33, implementation of complex current computation as described in FIG. 34 is shown. This means that the real part of complex current flowing in any branch is given by the sum of component currents in networks 1 and 2, and the imaginary part as the difference between component currents in networks 4 and 3, as described in equation 14.

$$\left. \begin{array}{l} I = I_r + jI_k \\ I_r = I^I + I^{II} \\ I_j = I^{IV} - I^{III} \end{array} \right\} \quad (14)$$

where subscripts r and i represent real and imaginary part, respectively. I, II, III, IV represent the four DC networks.

Step III: Computation of Generator Real Power and Swing Equation Update

The real power out of each generator in the system is calculated as the real part of the product of generator terminal voltage and complex conjugate of the generator current:

$$P_{e_i} = \mathrm{Re}\{E_{gi} \times I_{gi}\} = \mathrm{Re}\{E_{gi}\} \times \mathrm{Re}\{I_{gi}\} = \mathrm{Im}\{E_{gi}\} \times \mathrm{Im}\{I_{gi}\} \quad (15)$$

The swing equation describes the dynamics of a generator. Its input is a mechanical power from a prime mover and which is assumed constant. The output of a generator is an electrical power, which changes in accordance with the state of the network. The swing equation is a second order differential equation and its solution is the power angle of the generator. The power angle combines with generator internal voltage to constantly update the generator terminal voltage and hence the generator current. FIG. 35 describes the continuous cycle of power system core computation.

FIG. 36 describes the DC-network equivalent of a real power system bus and conditions for its implementation. Analyzing a sample power system and considering an arbitrary bus k with its complex voltage values, there are 4 networks with 4 buses $K^I$, $K_{II}$, $K_{III}$, and $K^{IV}$ as equivalents. For feasible bus voltages, the following conditions must be satisfied:

$$\left. \begin{array}{l} V_k^I = V_k^{III} = V_{k_I} \\ V_k^{II} = V_k^{IV} = V_{k_I} \end{array} \right\} \quad (16)$$

The feasible bus voltages condition is realizable with a constant PQ-load model [202]. Among other attributes of an analog emulator that contribute greatly to its versatility are the scale factors. Scale factors are constants that relate the values of the variables on the emulator to the values of the variables in the real system under study.

Case Studies and Results

Cases studied, which include 3-bus, 6-bus and 14-bus lossy and lossless power systems, were implemented using ABMs of PSpice. ABMs substitute real analog circuit implementation of the mathematical equations and scaled relationship that describe the states of the power system cases and emulate their behaviors. Power flow tests ere conducted on each of the cases. Similar cases were tested on industrial grade numerical simulation software, PowerWorld® v9.1 [212] and Power System Simulation for Engineering® (PSS/E) v.28.1 [213], for benchmarking. For the validation process, the following parameters were measured and/or calculated and compared with the benchmarks.

i. δj—Voltage angle difference between generator buses j and 1 (j=2, 3, . . . );

ii. Load bus complex voltage;

iii. Complex current flowing in each branch.

Simulation results obtained from the analog emulation engines implemented on ABMs of PSpice and that of the benchmarks are presented in Tables 10 through 13. The results compare favorably. This confirms the validity of the methodology as well as the technique of implementation.

TABLE 10

Summary Results for 3-Bus Power System (lossless system)

| | PowerWorld | PSS/E | Analog Emulator |
|---|---|---|---|
| Relative Power Angle ($δ_n$) in degree | 0.94° | 0.9° | 0.94° |
| Load Bus (V3) Voltage (Vpu) | 0.988∠−3.17° | 0.988∠−3.2° | 0.9880∠−3.17° |
| Current in Branch 2_1 (I, A) | 343.1848 | 343 | 343.2∠−0.47° |
| Current in Branch 1_3 (I, A) | 784.49 | 784.5 | 784.5∠−13.91° |
| Current in Branch 2_3 (I, A) | 503.87 | 503.9 | 503.9∠−10.70° |

TABLE 11

Summary Results for 3-Bus Power System (lossy system)

| | PowerWorld | PSS/E | Analog Emulator |
|---|---|---|---|
| Relative Power Angle ($δ_{21}$) in degree | 0.65° | 0.6° | 0.65° |
| Load Bus (V3) Voltage (Vpu) | 0.9675∠−1.03° | 0.968∠−1° | 0.9675∠−1.03° |

TABLE 11-continued

Summary Results for 3-Bus Power System
(lossy system)

|  | PowerWorld | PSS/E | Analog Emulator |
|---|---|---|---|
| Current in Branch 2_1 (I, A) | 334.26 | 334 | 334.6∠−45.30° |
| Current in Branch 1_3 (I, A) | 691.39 | 691 | 691.6∠−1.36° |
| Current in Branch 2_3 (I, A) | 654.24 | 654 | 654.2∠−23.1° |

TABLE 12

Summary Results for 6-Bus Power System
(Lossy System)

|  | PowerWorld | PSS/E | Analog Emulator |
|---|---|---|---|
| Relative Power Angle ($\delta_{21}$) in degree | −2.10° | −2.1° | −2.10° |
| Relative Power Angle ($\delta_{31}$) in degree | −2.71° | −2.7° | −2.71° |
| Load Bus (V4) Voltage (Vpu) | 0.974∠−7.35° | 0.974∠−7.3° | 0.974∠−7.35° |
| Load Bus (V5) Voltage (Vpu) | 0.988∠−4.69° | 0.988∠−4.7° | 0.988∠−4.69° |
| Load Bus (V6) Voltage (Vpu) | 0.983∠−6.36° | 0.983∠−6.4° | 0.9829∠−6.36° |
| Current in Branch 1_2 (I, A) | 344.86 | 345 | 344.86∠−29.76° |
| Current in Branch 1_5 (I, A) | 758.72 | 759 | 758.72∠−20.98° |
| Current in Branch 2_5 (I, A) | 388.84 | 389 | 388.84∠−15.95° |
| Current in Branch 2_6 (I, A) | 515.047 | 515 | 515.04∠−11.7° |
| Current in Branch 3_6 (I, A) | 376.53 | 377 | 376.54∠−32.34° |

TABLE 13

Summary Results for 14-Bus Power System
(Lossless)

|  | PowerWorld | PSS/E | Analog Emulator |
|---|---|---|---|
| Relative Power Angle ($\delta_{21}$) in degree | −1.08° | −1.1° | −1.08° |
| Relative Power Angle ($\delta_{11}$) in degree | −0.75° | −0.8° | −0.75° |
| Relative Power Angle ($\delta_{61}$) in degree | −8.09° | −8.1° | −8.09° |
| Relative Power Angle ($\delta_{81}$) in degree | −7.30° | −7.3° | −7.30° |
| Load Bus (V4) Voltage (Vpu) | 0.989∠−5.51° | 0.989∠−5.5° | 0.989∠−5.51° |
| Load Bus (V5) Voltage (Vpu) | 0.991∠−4.75° | 0.991∠−4.8° | 0.991∠−4.75° |
| Load Bus (V7) Voltage (Vpu) | 0.984∠−9.22° | 0.984∠−9.2° | 0.984∠−9.22° |
| Load Bus (V9) Voltage (Vpu) | 0.979∠−11.15° | 0.979∠−11.2° | 0.979∠−11.15° |
| Load Bus (V10) Voltage (Vpu) | 0.980∠−11.68° | 0.980∠−11.7° | 0.980∠−11.68° |
| Load Bus (V11) Voltage (Vpu) | 0.987∠−10.70° | 0.987∠−10.7° | 0.987∠−10.70° |
| Load Bus (V12) Voltage (Vpu) | 0.982∠−12.42° | 0.982∠−12.4° | 0.982∠−12.42° |

TABLE 13-continued

Summary Results for 14-Bus Power System
(Lossless)

|  | PowerWorld | PSS/E | Analog Emulator |
|---|---|---|---|
| Load Bus (V13) Voltage (Vpu) | 0.980∠−12.88° | 0.980∠−12.9° | 0.980∠−12.88° |
| Load Bus (V14) Voltage (Vpu) | 0.979∠−11.20° | 0.979∠−11.2° | 0.979∠−11.20° |
| Current in Branch 1_5 (I, A) | 311.63 | 312.63 | 311.63∠−8.52° |
| Current in Branch 2_5 (I, A) | 309.85 | 309.85 | 309.85∠−10.86° |
| Current in Branch 5_4 (I, A) | 262.5 | 262.5 | 262.50∠−12.84° |
| Current in Branch 4_9 (I, A) | 151.21 | 151.21 | 151.21∠−14.42° |

Simulation outputs of analog emulator were measured in rectangular form and/or radians. Conversions to polar representation and/or degree were made for easy comparisons with the benchmarks. Also, for convenience and efficient analog emulation implementation, certain power system variables and parameters were represented by other circuit variables. FIG. 37 summarizes variable representations used in this example. Since conversion ratio used between current-voltage or power-current is 1:1, obtained values remain representative in quantity.

Generator Model

The proposed circuit is based largely upon the classical generator model. This section presents a short review of the basics behind the generator model developed and scaling of the model to an appropriate analog circuit. The classical generator model that will be used for this example consists of a voltage source behind an impedance, where V∠0 represents the generator terminal voltage, E∠δ denotes the internal generator voltage and angle, and Z representing the transient reactance of the generator 'dX. The generator consisting of these elements can be seen in FIG. 39.

With this model, the electrical angle, δ, is unknown, and therefore, needs to be computed. In order to determine the electrical angle, the dynamics of the generator were captured. The simplified mechanical equation that governs the motion of the generator rotor, describes the swing between the mechanical and electrical angle, otherwise known as the swing equation, $$M\ddot{\delta}+D\dot{\delta}+P_e(\delta)=P_m \quad (17)$$

where M is the generator inertia coefficient, D is the damping coefficient, $P_e$ is the electrical power output, and $P_m$ is the mechanical input power. The solution we seek, the load flow, corresponds to the steady state solution of this equation.

In order to simplify the calculation required in the analog circuit, the electrical power output of the generator will be solved in rectangular form. For converting the polar notation to rectangular form, only the real and imaginary components will be necessary and the calculation for the electrical output power of the generator model can be rewritten as the following equation:

$$\text{Re}\{S\}=\text{Re}\{V \cdot I^e\}$$

$$P_e=E_{Rest} \cdot I_{Rest}+E_{Imag} \cdot I_{Imag} \quad (18)$$

$$P_e=|E| \cdot \cos \delta \cdot \text{Re}\{I\}+|E| \cdot \sin \delta \cdot \text{Im}\{I\}$$

The representation of the electrical output power will need to be applied directly into the swing equation for the calculation of the electrical angle. The functionality of the swing equation as seen in the block diagram in FIG. 40, will provide us with a layout for the generator model that will be presented in the following section.

With many different models representing the generator available, we will use the classical model while neglecting damping. This will simplify the non-linear dynamics of the classical generator without significantly reducing the precision of the model [305]. With these assumptions, the swing equation (17) will reduce to only the difference between the mechanical input power and the electrical output power. After factoring in the generator inertia coefficient and taking two integration steps of the angular acceleration, the solution of the electrical power angle can be calculated in the following form:

$$\delta = \frac{1}{M} \int \int (P_m - P_e(\delta)) dt dt \qquad (19)$$

Scaling Parameters

In order to realize a power system using analog emulation, two different scaling factors need to transpire. The time scaling parameter is for the computation speedup of the emulator while the scaling of parameter space is for the electrical angle to be represented as voltage in the circuit. Next is the introduction of the time scale factor, $\tau$, a constant which will represent a computational speedup of T times faster than the real-time system. This factor is directly proportional to the real time of the power system, t, for a given simulation time of the analog emulator, T. With this advantage, we can include the time scale factor in the solution of the electrical angle (19), capable of scaling the computation time of emulator in the following manner:

$$\tau = \frac{t}{T} \qquad (20)$$

$$\delta = \frac{\tau^2}{M} \int \int (P_m - P_e(\delta)) dt dt$$

The time scale factor needs to be squared because of the second order nature involved in the dynamics of the classical generator model. A collaborating factor that may influence the choice of the time scale is that the error in the integration may be accentuated by long emulation times.

Another scaling procedure is actual parameter scaling of the electrical angle to voltage. Introducing the desired voltage, u to be represented as a voltage level in the circuit that is equivalent to it radians, (20) can be rewritten as the following equation:

$$\delta = \frac{\tau^3}{M} \frac{v}{\pi} \int \int (P_m - P_e(\delta)) dt dt \qquad (21)$$

With the generator model and scaling parameters defined, we can proceed to develop this model using CMOS analog devices. Before selecting the devices we need to identify the circuit parameters needed to scale the power system to an analog circuit and the parameters needed to achieve reconfigurability within the model.

Reconfigurable Generator Model

The next step of modeling addresses the concept of reconfigurability in the generator model. The actual analog circuit representing the generator needs to incorporate a programmable analog device into model to obtain controllable behaviors of the power system.

Instead of the typical operational amplifiers to realize some of the components needed, the operational transconductance amplifier (OTA) will be used because of its ability to control its gain by an external current (or voltage).

The OTA has the basic properties of a voltage-controlled current source (VCCS) and the output current is obtained by:

$$I_e = g_m(\Delta V_m) \qquad (22)$$

a product of the transconductance parameter and the differential input voltage. The transconductance, gm, can be increased or decreased as a function of the input voltage by varying the amplifier bias current, Iabc, according to this equation:

$$g_m = \rho \cdot I_{abc} \qquad (23)$$

as a gain and is dependent on a non-linear device constant, p and the amplifier bias current as seen in (23) [306]. Ideally, the desirable gain of an OTA would always be constant, with a linear input and output relationship. Since this is not the case, measures will need to be considered because of the errors that will result from the non-linear transconductance of the OTA.

Circuit Parameter Transformation

To achieve the difference between the mechanical input power and the electrical output power on a circuit, power is quantified as current. This introduces a circuit scaling parameter, Kp, a constant ratio between the circuit current and model power quantity as seen below.

$$K_p = \frac{I_{max}}{P_{max}} \qquad (24)$$

The analog circuit developed to solve the swing equation of the generator will consist of two first-order integrators built using OTAs [306]. The output of the double integration process is voltage representing the electrical angle and is calculated in the following manner analogous to (21).

$$\delta \equiv V = \frac{g_{m1} \cdot g_{m1}}{C_1 \cdot C_2} \int \int (I_m - I_e(V)) dt dt \qquad (25)$$

In this equation, the $I_e(V)$ represents electrical power which is dependent on the electrical angle. The components $C_1$ and $C_2$ are the values of the integration capacitor needed in the first and second integrators, respectively. The transconductance parameters, $g_{m1}$ and $g_{m2}$, are the gains of the first and second OTAs in the double integration process. These values can be reconfigured using the amplifier bias currents to correspond to various generator characteristics and a given range of speedup times.

Analog Generator Model

In order to provide the analog implementation of the algorithm described in the previous section, an approach to simulate the block diagram of the swing equation (19) needs to be realized. A functional block diagram of the generator behavioral model is made up of voltage-controlled current sources (VCCS), current-controlled voltage source (CCVS), amplifiers, integrators, and various other components that determine the electrical output power of the generator. FIG. 41 represents the block diagram of the analog behavioral model of the generator.

Similar to $I_e$, the current, $I_m$, is used to quantify mechanical power. The difference between this current and $I_e$ is used as the input into the double integrator scaled as voltage. The voltage output of the double integrator is equivalent to the electrical angle given by (21). By definition, electrical power output is dependent on generator terminal voltage and current. Upon calculation of the electrical power, $P_e(\delta)$, it will be scaled to a corresponding current value, $I_e(V)$, and the process updates itself until a possible stable steady-state solution is attained.

To achieve this operation on a circuit, appropriate CMOS devices must be selected. Considerations used for selection include minimal device power consumption, suitable device operating ranges, and transconductance. The devices selected for this model will use commercial off-the-shelf (COTS) CMOS components including the National Semiconductor LM13700 OTA [307] and the Analog Devices AD639 Trigonometric Converter [308]. Having the devices selected, an example of the analog emulator will be discussed, along with emulation results.

Power System Example

The model in FIG. 41 was used in a simple power system problem [39]. For this example, the generator delivered power to an infinite bus through a transmission line and the solution of the electrical angle can be seen as described in equation (19).

The calculation of the steady-state solution of the electrical angle of the generator can be found by solving the instantaneous generator power for the system, $$P_m = \frac{|E||V|}{(X'_d + X_L)} \sin \delta^0 \qquad (26)$$

$$P_m = P_{e,max} \sin \delta^0$$

where $|E|$ is the internal generator voltage, $|V|$ is the bus voltage, $X'_d$ is the transient reactance of the generator, and $X_L$ is the line reactance. For a given mechanical input power, the steady-state solution of the electrical angle can be found with given system parameters.

The analog circuit for the single-machine power system consisted of four OTAs, a trigonometric converter, and resistors and capacitors as seen in FIG. 42. The controllable gains were calculated in order to fit the circuit to the power system, which was dependent on the selection of the resistor and capacitors in the circuit. The selection of the resistor values were needed to scale the parameters to proper voltage levels for the OTAs to function within their linear operating range. The capacitor selection determined the integration time of the circuit.

The gain representing the maximum electrical power output, $P_{e,max}$, is transformed into the maximum current gain parameter A, which is equivalent to $I_{e,max}$. The maximum allowable current parameter will be controlled through the gain of an OTA, $g_{mA}$. This can be changed for different power system parameters in the following manner from equations (24) and (26).

$$A = K_p \cdot P_{e,max}; g_{m1} = A \cdot \frac{R_1 + R_2}{R_2} \qquad (27)$$

$$g_{m1} = \frac{K_p |E||V|(R_1 + R_2)}{(X'_d + X_L)R_2}$$

The two gains of the OTAs within the double integrator are considered identical to one another. Using equations (21), (24), and (25), the gains can be characterized in terms of the following:

$$M = \frac{H}{\pi f_o} \qquad (28)$$

$$g_{m1} = g_{m2} = \sqrt{\frac{P_m \cdot C_1 \cdot C_2 \cdot \tau^2 \cdot \upsilon}{K_p \cdot M \cdot R \cdot \pi}}$$

For equation (27), the power system parameters are directly associated with a controllable gain parameter. In equation (28), the controllable gain is directly associated with the generator inertia constant and the scaling parameters defined in equations (20) and (21). This allows for a completely reconfigurable classical generator model that provides computational speedup for conventional digital methods.

The reconfigurable classical generator model has been tested in a single-machine power system. The results of the simulation shown are from the circuit emulator of FIG. 42 using PSpice and will be compared to simulation results obtained using PSpice Analog Behavior Models (ABM). This comparison is validated from previous work [310] conducted using Analog Behavior Models of sample power systems, where the results obtained compared rather favorably with traditional load flow solvers such as PSS/E and PowerWorld®.

The power system parameters and the associated circuit parameters based on the previous equations for the simulation example are listed in Table 14. For this example, the mechanical input power is fixed constant at 0.5 per unit (p.u.) while the emulator solves for a steady-state solution.

The results from the power system can be seen in FIG. 43a and the results of the analog emulator can be seen in FIG. 43b. With both converging to approximately the same steady-state solution, the analog emulator solved from the electrical angle of the swing equation much faster than the actual power system. This clearly demonstrates the capability of the computational speedup the analog emulator possesses with respect to real-time.

TABLE 14

System and Circuit Parameters

| Power System | | Circuit Emulator | |
|---|---|---|---|
| $\|E\|$ | 1.8 | $C_1$ (ηF) | 100 |
| $\|V\|$ | 1.0 | $C_2$ (ηF) | 100 |
| $X_d$ (p.u.) | 1.0 | $g_{m1}$ (mho) | 0.0182 |
| $X_L$ (p.u.) | 0.4 | $g_{m2}$ (mho) | 0.0182 |
| H (sec) | 5.0 | $K_p$ | $1.010^{-4}$ |
| $P_m$ (p.u.) | 0.5 | $\upsilon$ (V) | 3.6 |
| $f_o$ (Hz) | 60 | $\tau$ | $5.010^3$ |
| | | A (μA) | 129 |
| | | $I_m$ (μA) | 50 |
| | | $g_{mA}$°(mho) | 0.0130 |

Upon closer inspection, the results of the actual angular solution are different with a large degree of error. The ABM power system model solved for the angular solution of 22.89°, while the OTA analog emulator model solved for the angular solution of 27.79°. The difference between the two results has an error of approximately 21~22%. Since the steady-state calculation of the actual electrical angle using equation (26) results in an angle of 22.89°, the analog emulator seems to produce the error.

Since the present invention focuses on the study of load flow analysis of power systems, and not the intricate design of electronic devices, the offset correction method that will be applied to this example will be the post-processing of the data to correct for the offset of the devices.

To correct for the offset, the circuit was set with zero mechanical input power, Pm=0. The circuit emulator provided an offset solution because the gains amplify the offsets within the devices. This angular offset solution was subtracted from the PSpice emulator simulation for the given mechanical power. FIG. 44 shows the results of the offset correction compared to the original results of the analog emulator with PSpice. With the offset eliminated from the PSpice solution, the corrected angular solution is now 22.74°, which is much closer to the desired solution. The results from this example and the errors calculated are tabulated in Table 15.

TABLE 15

Result Comparison and Errors

| Method | Delta (deg) | Error (%) |
| --- | --- | --- |
| Calculation | 22.885 | — |
| PSpice ABM | 22.886 | 0.00 |
| PSpice OTA | 22.787 | 21.4 |
| PSpice OTA Offset Correction | 22.740 | 0.63 |

This single-machine infinite-bus power system example shows that the analog emulator achieves computational speedups over the real power system. The disadvantage of the analog circuit is that the accuracy of the circuit may not be as good as current digital computer methods for solving load flow. The results show with offset correction methods, an advantageous tradeoff is made between accuracy and computational speedup.

The example provided results of the advantages of the analog emulator including the ability to reconfigure system parameters and the computational speedups achieved in the circuit. The present invention is applicable to many different areas. One method would be the introduction of initial conditions on the integrator to start at a value that may be closer to a desired stable solution. Also, more complicated models could be developed to expand this model to include damping and higher order generator models.

As has been demonstrated above, the present invention is useful for modeling of power systems and power system components. This can be used for fail-safe planning, as well as for operations planning. Thus, the present system is flexible enough to allow long-term planning over the life of the system, as well as to facilitate short-term operations planning for operating the system as little as 24 hours to 7 days ahead of time. This is possible since the present invention uses the hardware up to about 10 times more efficiently than all-purpose computing platforms.

The hardware of the present invention, including the FPGA and related components, are flexible enough to be customized for a variety of different calculations. Thus, although the present invention has been exemplified for power system planning, it is generally applicable to other systems requiring complex computations as well.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms.

REFERENCES

[1] Feng Tu and A. J. Flueck, A message-passing distributed-memory parallel power flow algorithm, Power Engineering Society Winter Meeting, 2002. IEEE, Volume 1 (2002), pp 211-216.

[2] X. Wang and S. G. Ziavras, Parallel Direct Solution of Linear Equations on FPGA-Based Machines, Workshop on Parallel and Distributed Real-Time Systems (17th Annual IEEE International Parallel and Distributed Processing Symposium), Nice, France, Apr. 22-23, 2003.

[3] Keith Underwood, FPGAs vs. CPUs: Trends in peak floating point performance, ACM/SIGDA Twelfth ACM International Symposium on Field-Programmable Gate Arrays, (Monterrey, Calif.), February 2004.

[4] A. R. Bergen, V. Vittal, Power Systems Analysis, 2nd Edition, Prentice Hall, 2000.

[5] P. Amestoy, T. A. Davis, and I. S. Duff, An approximate minimum degree ordering algorithm, SIAM J. Matrix Anal. Applic., 17 (1996), pp. 886-905.

[6] M. Yannakakis. Computing the minimum fill-in is NP-Complete, SIAM J. Alg. Disc. Meth., 2 (1981), pp. 77-79.

[7] W. H. Press, S. A. Teukolsky, W. T. Vettering and Brian P. Flannery, Numerical Recipes in C: the Art of Scientific Computing, 2nd Edition, New York: Cambridge University Press, 1992.

[8] T. A. Davis and I. S. Duff, An unsymmetric-pattern multifrontal method for sparse lu factorization, SIAM J. Matrix Anal. Applic., 18 (1997), pp. 140-158.

[101] R. Fried, R. S. Cherkaoui, and C. C. Enz, "Low-Power CMOS, Analog Transient-Stability-Simulator for a Two-Machine Power System," presented at ISCAS, Hong-Kong, 1997.

[102] R. Fried, R. S. Cherkaoui, C. C. Enz, A. Ger-mond, and E. A. Vittoz, "Approaches for analog VLSI simulation of the transient stability of large power networks," Ieee Transactions on Circuits and Systems I-Fundamental Theory and Applications, vol. 46, pp. 1249-1263, 1999.

[103] R. Fried, R. S. Cherkaoui, C. C. Enz, A. Germond, and E. A. Vittoz, "Analog VLSI Solution to the Stability Study of Power Networks," presented at ICECS, 1996.

[104] S. P. Carullo, M. Olaleye, and C. O. Nwankpa, "VLSI Based Analog Power System Emulator for Fast Contingency Analysis," presented at Hawaii International Conference on System Science, Hawaii, 2004.

[105] J. Ramirez-Angulo and I. Grau, "Wide gm Adjustment Range, Highly Linear OTA with Linear Programmable Current Mirrors," presented at ISCAS, 1992.

[106] Z. Wang, "Making CMOS OTA a Linear Transconductor," Electronics Letters, vol. 26, pp. 1448-1449, 1990.

[107] C. A. Karybakas, C. Kosmatopoulos, and T. Laopoulos, "Improved Temperature Compensation of Otas," Electronics Letters, vol. 28, pp. 763-764, 1992.

[108] N. Semiconductor, "LM13700 Dual Operational Transconductance Amplifiers with Linearizing Diodes and Buffers," 2000.

[109] A. Gratz, "Operational Transconductance Amplifiers," Unpublished.

[110] R. Wunderlich, J. Oehm, A. Dollberg, and K. Schumacher, "A Linear Operational Transconductance Amplifier with Automatic Offset Cancellation and Transconductance Calibration," presented at International Conference on Electronics, Circuits and Systems, 1999.
[111] "PowerWorld Simulator 10.0," PowerWorld Corporation, 2004.
[201] Capture CIS version 9.2.3, Cadence Design Systems, Inc.
[202] M. B. Olaleye and C. O. Nwankpa, "Analog Behavioral Models for the Purpose of Analog Emulation of Large Scale Power Systems," The Proceedings of the 36th North American Power Symposium (NAPS), pp. 97-104, August 2004.
[203] B. Gilbert, "A monolithic Microsystem for Analog Synthesis of Trigonometric Functions and Their Inverses", IEEE Journal of Solid State Circuits, Vol. SC-17, No. 6, pp. 1179-1191, December 1982.
[204] P. C. Krause, T. A. Lipo and D. P. Carroll, "Applications of Analog and Hybrid Computation in Electric Power System Analysis," Proceedings of the IEEE, Vol. 62, No. 7, July 1974.
[205] P. G. McLaren, P. Forsyth, A. Perks and P. R. Bishop, "New Simulation Tools for Power Systems", Transmission and Distribution Conference and Exposition, 2001. IEEE/PES, vol. 1, 28, pp. 91-96, Oct-2 November, 2001.
[206] A. Greenwood, Electrical Transients in Power Systems. 2nd Edition, John Wiley & Sons, Inc., New York, 1991
[207] G. A. Korn and T. M. Korn, Electronic Analogue Computers (D-C Analogue Computers), McGraw-Hill, New York, 2nd edition, 1956.
[208] M. Hirakami and W. Neugebauer, "Transient Network Analyzer Operation with Digital Computer Control and Analysis," IEEE Transactions on Power Apparatus and Systems, Vol. PAS-100, No. 4, April 1981.
[209] M. Crow, Computational Methods for Electric Power Systems. CRC Press, 2003.
[210] R. W. Newcomb and J. D. Lohn, "Analog VLSI for Neural Networks" in Handbook of Brain Theory and Neural Networks, M. Arbib Ed., Bradford Books, MIT Press, 1995.
[211] R. Fried, R. S. Cherkaoui, C. C. Enz, A. Germond, and E. A. Vittoz, "Approaches for Analog VLSI Simulation of the Transient Stability of Large Power Networks," IEEE Transactions on Circuits and Systems-I: Fundamental Theory and Applications, Vol. 46, No. 10, pp. 1249-1263, October 1999.
[212] PowerWorld Simulator v.9.1, PowerWorld Corporation, Champaign Ill.
[213] Power System Simulator for Engineering (PSS/E)-28.1.4, Power Technologies, Inc.
[301] J. B. Ku and S. C. Lin, Low-Voltage SOI CMOS VLSI Devices and Circuits. New York: John Wiley & Sons Inc, 2001.
[302] R. Fried, R. Cherkaoui, C. Enz, A. Germond, and E. Vittoz, "Approaches for analog VLSI simulation of the transient stability of large power networks," IEEE Transactions on Circuits and Systems I-Fundamental Theory and Applications, vol. 46, pp. 1249-1263, 1999.
[303] J. Gu, G. G. Karady, and R. Farmer, "Real-time analysis of transient stability using reconfigurable analog VLSI," IEEE Transactions on Power Systems, vol. 18, pp. 1207-1209, 2003.
[304] J. Yakaski and C. Nwankpa, "Insight into Reconfigurable Analog Emulation of the Classical Generator Model," presented at The 36th Annual North American Power Symposium, University of Idaho, Moscow, Id., 2004.
[305] H. E. Brown, Solution of Large Networks by Matrix Methods. New York: Wiley, 1985.
[306] R. L. Geiger and E. Sanchez-Sinencio, "Active Filter Design Using Operational Transconductance Amplifiers: A Tutorial," in IEEE Circuits and De-vices Magazine, vol. 1, 1985, pp. 20-32.
[307] National Semiconductor, LM13700 Dual Operational Transconductance Amplifiers with Linearizing Diodes and Buffers, August 2000.
[308] Analog Devices, AD639 Universal Trigonometric Function Converter, October 1994.
[309] A. Bergen and V. Vittal, Power System Analysis, 2nd ed: Prentice Hall, 2000.
[310] M. Olaleye and C. Nwankpa, "Analog Behavioral Models for the Purpose of Analog Emulation of Large Scale Power Systems," presented at The 36th Annual North American Power Symposium, University of Idaho, Moscow, Id., 2004.
[311] R. Wunderlich, J. Oehm, A. Dollberg, and K. Schumacher, "A Linear Operational Transconductance Amplifier with Automatic Offset Cancellation and Transconductance Calibration," presented at The 6th IEEE International Conference on Electronics, Circuits and Systems, University of Patras, Greece, 1999.

What is claimed is:

1. An apparatus for carrying out complex computations of power flow in a power transmission system which comprises:

means for calculating voltages at a bus in the power transmission system by equating power entering a bus to a summation of powers leaving the bus as represented by equation (15) for real power calculations:

$$P_{e_i} = \text{Re}\{E_{gi} \times I_{gi}\} = \text{Re}\{E_{gi}\} \times \text{Re}\{I_{gi}\} = \text{Im}\{E_{gi}\} \times \text{Im}\{I_{gi}\} \quad (15)$$

said means including a DC network emulation of a power system bus k of the power transmission system, said power system bus k having complex voltage values and being represented by four networks with four buses $K^I$, $K^{II}$, $K^{III}$ and $K^{IV}$ as equivalents and for feasible bus voltages the following conditions of equation (16) are satisfied:

$$\left. \begin{array}{l} V_k^I = V_k^{III} = V_{k_I} \\ V_k^{II} = V_k^{IV} = V_{k_I} \end{array} \right\}; \quad (16)$$

said means for calculating the real power further including a field programmable gate array, said field programmable gate array programmed for implementation of Gaussian elimination by decomposition of a matrix into lower and upper triangulation factors and forward and backward elimination;

memory operably connected to said field programmable gate array, a device for maintaining pivoting information operably connected to said field programmable gate array; and a table to track elimination progress.

2. The apparatus as claimed in claim 1, wherein said device for maintaining pivoting information comprises a lookup table and memory pointers.

3. The apparatus as claimed in claim 2, wherein said field programmable gate array implements the following Gaussian elimination for each column in the matrix loop:

(a) search the column for a pivot element;
(b) pivot if necessary;
(c) normalize a pivot column;

(d) update a remaining portion of the matrix;
(e) multiply to form a sub-matrix update; and
(f) update a value or create a fill-in.

4. The apparatus as claimed in claim 3, wherein said apparatus is configured to simultaneously perform memory reads and memory writes between said field programmable gate array and said memory.

5. The apparatus as claimed in claim 4, further comprising a random access memory for storing an array of the indices of non-zero elements in the matrix, said random access memory being operably connected to said field programmable gate array.

6. The apparatus as claimed in claim 5, further comprising index rejection logic to select appropriate indices from said stored array of indices.

7. The apparatus as claimed in claim 6, wherein said memory comprises a row cache of memory of sufficient size to store a largest sub-matrix update for said computation.

8. The apparatus as claimed in claim 7, wherein further comprising a table to keep track of elimination progress.

9. The apparatus as claimed in claim 1, wherein said complex computation involves solution of at least one sparse linear system.

10. The apparatus as claimed in claim 1, further comprising means for calculating complex voltages at power transmission system buses by solving a dynamic swing equation by combining a resulting power angle, δ and a desired voltage magnitude.

11. The apparatus as claimed in claim 10, further comprising a means for calculating currents in the power transmission system.

12. The apparatus as claimed in claim 11, wherein said means for calculating currents employs four separate DC resistive network simulations to emulate complex current flow and transforms a transmission line complex impedance to a corresponding resistive value as in equation (13):

$$\left. \begin{array}{l} Y = \dfrac{1}{Z} = \dfrac{1}{R+jX} = \dfrac{R-jX}{R^2+X^2} \\ Y_{Ro} = \dfrac{R}{R^2+X^2} = Y_r \\ Y_{Ro} = (-)\dfrac{X}{R^2+X^2} = Y_1 \end{array} \right\} \quad (13)$$

and a real part of complex current is given by a sum of component currents in network simulations 1 and 2, and an imaginary part as a difference between component currents in network simulations 4 and 3, as described in the equation (14).

$$\left. \begin{array}{l} I = I_r + jI_I \\ I_r = I^I + I^{II} \\ I_r = I^{IV} = I^{III} \end{array} \right\} \quad (14)$$

13. A system for emulating power flow in a power transmission system, which comprises:
a power supply;
a variable resistor including at least one reconfigurable operational transconductance amplifier operably connected to said power supply;
a device for measuring a current or voltage output of said system; and
a DC network emulation of a power system bus k of the power transmission system, said power system bus k having complex voltage values and being represented by four networks with four buses $K^I$, $K^{II}$, $K^{III}$ and $K^{IV}$ as equivalents and for feasible bus voltages the following conditions of equation (16) are satisfied:

$$\left. \begin{array}{l} V_k^I = V_k^{III} = V_{k_I} \\ V_k^{II} = V_k^{IV} = V_{k_I} \end{array} \right\} . \quad (16)$$

14. The system as claimed in claim 13, comprising at least two reconfigurable operational transconductance amplifiers for modeling power transmission in at least two directions.

15. A method for emulating a power transmission system comprising the steps of:
(a) calculating a complex voltage from at least one bus using a dynamic swing equation;
(b) calculating a complex current flowing in a branch of said power transmission system; and
(c) calculating a real power of said at least one bus using a DC network emulation of a power system bus k of the power transmission system, said power system bus k having complex voltage values and being represented by four networks with four buses $K^I$, $K^{II}$, $K^{III}$ and $K^{IV}$ as equivalents and for feasible bus voltages the following conditions of equation (16) are satisfied:

$$\left. \begin{array}{l} V_k^I = V_k^{III} = V_{k_I} \\ V_k^{II} = V_k^{IV} = V_{k_I} \end{array} \right\} ; \quad (16)$$

and
(d) updating the dynamic swing equation based on a result of step (c).

16. The method as claimed in claim 15, further comprising the step of:
(e) solving for a steady-state solution.

17. The method as claimed in claim 16, further comprising the step of:
(f) correcting for offset of said steady-state solution by calculating an offset solution for zero mechanical input power, and subtracting the offset solution from said steady-state solution.

18. The method as claimed in claim 15, wherein the complex current is calculated using four separate DC resistive network simulations to emulate complex current flow and transforms a transmission line complex impedance to a corresponding resistive value as in equation (13):

$$\left. \begin{array}{l} Y = \dfrac{1}{Z} = \dfrac{1}{R+jX} = \dfrac{R-jX}{R^2+X^2} \\ Y_{Ro} = \dfrac{R}{R^2+X^2} = Y_r \\ Y_{Ro} = (-)\dfrac{X}{R^2+X^2} = Y_1 \end{array} \right\} \quad (13)$$

and a real part of complex current is given by a sum of component currents in network simulations 1 and 2, and an imaginary part as a difference between component currents in network simulations 4 and 3, as described in the equation (14).

* * * * *